US011171076B2

(12) United States Patent
Yu et al.

(10) Patent No.: US 11,171,076 B2
(45) Date of Patent: Nov. 9, 2021

(54) COMPUTE-IN-MEMORY PACKAGES AND METHODS FORMING THE SAME

(71) Applicant: Taiwan Semiconductor Manufacturing Company, Ltd., Hsinchu (TW)

(72) Inventors: Chen-Hua Yu, Hsinchu (TW); Kuo-Chung Yee, Taoyuan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/529,235

(22) Filed: Aug. 1, 2019

(65) Prior Publication Data

US 2020/0118908 A1   Apr. 16, 2020

Related U.S. Application Data

(60) Provisional application No. 62/743,693, filed on Oct. 10, 2018.

(51) Int. Cl.
*H01L 23/48* (2006.01)
*H01L 23/31* (2006.01)
*H01L 25/065* (2006.01)
*H01L 23/00* (2006.01)
(Continued)

(52) U.S. Cl.
CPC .......... *H01L 23/481* (2013.01); *H01L 21/563* (2013.01); *H01L 21/76816* (2013.01); *H01L 23/3107* (2013.01); *H01L 24/09* (2013.01); *H01L 25/0652* (2013.01); *H01L 2224/02372* (2013.01)

(58) Field of Classification Search
CPC ... H01L 23/481; H01L 21/09; H01L 23/3107; H01L 21/563; H01L 21/76816; H01L 25/0652; H01L 24/92; H01L 23/5389; H01L 25/105
USPC .................. 257/723, 777; 438/107, 109, 110
See application file for complete search history.

(56) References Cited

U.S. PATENT DOCUMENTS

| 10,256,210 B2 | 4/2019 | Lin et al. |
| 2005/0121764 A1 | 6/2005 | Mallik et al. |
| 2014/0084456 A1 | 3/2014 | Kang et al. |

(Continued)

FOREIGN PATENT DOCUMENTS

| CN | 101542701 A | 9/2009 |
| CN | 102169845 A | 8/2011 |

(Continued)

*Primary Examiner* — Thinh T Nguyen
(74) *Attorney, Agent, or Firm* — Slater Matsil, LLP

(57) ABSTRACT

A method includes placing a first plurality of dies over a carrier. The first plurality of dies include at least a first logic die and a first memory die, placing a second plurality of dies over the first plurality of dies. The second plurality of dies are electrically coupled to the first plurality of dies, and include at least a second logic die and a second memory die. A third plurality of dies are placed over the second plurality of dies, and are electrically coupled to the first plurality of dies and the second plurality of dies. The third plurality of dies include at least a third logic die and a third memory die. The method further includes forming electrical connectors over and electrically coupling to the first plurality of dies, the second plurality of dies, and the third plurality of dies.

21 Claims, 37 Drawing Sheets

(51) Int. Cl.
  *H01L 21/56* (2006.01)
  *H01L 21/768* (2006.01)

(56) References Cited

U.S. PATENT DOCUMENTS

| | | | |
|---|---|---|---|
| 2015/0171006 A1* | 6/2015 | Hung et al. | ......... H01L 23/5226 257/774 |
| 2017/0053902 A1 | 2/2017 | Yu et al. | |
| 2019/0386053 A1 | 12/2019 | Amamo | |

FOREIGN PATENT DOCUMENTS

| CN | 1021169845 A | 8/2011 |
|---|---|---|
| CN | 106449609 A | 2/2017 |
| CN | 110235253 A | 9/2019 |
| TW | 201714275 A | 4/2017 |
| WO | 2009146587 A1 | 12/2009 |

\* cited by examiner

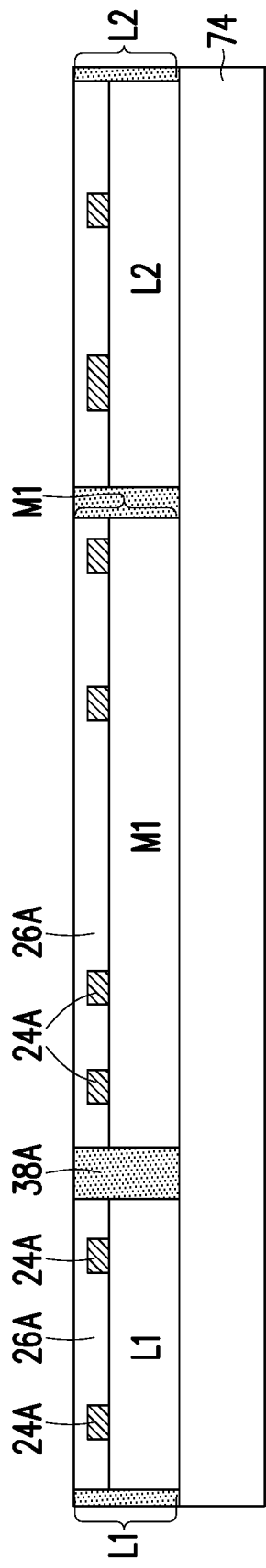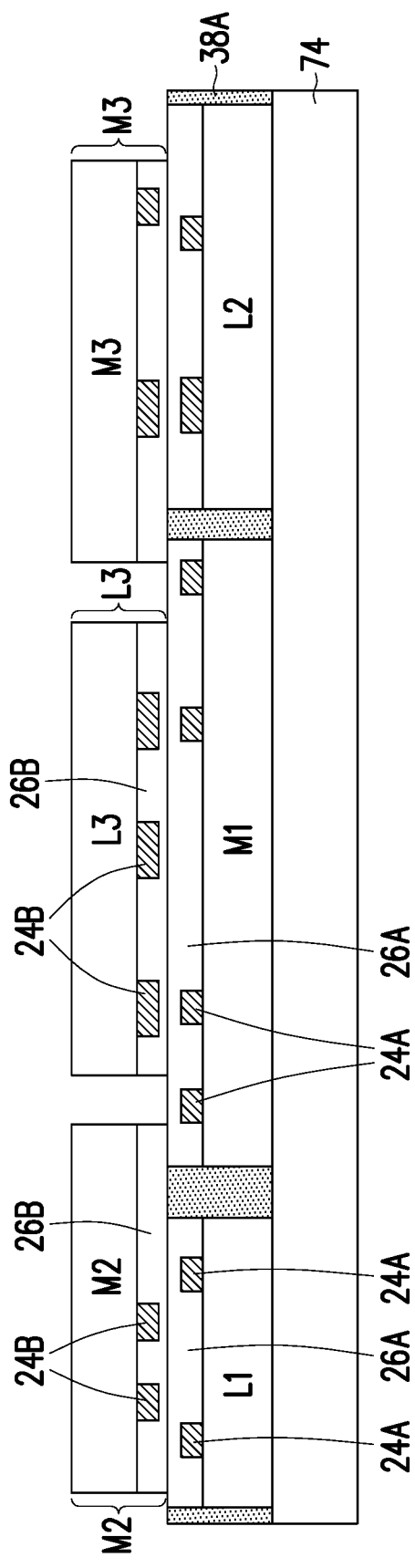

COMPUTE-IN-MEMORY PACKAGES AND METHODS FORMING THE SAME

PRIORITY CLAIM AND CROSS-REFERENCE

This application claims the benefit of the following provisionally filed U.S. patent application: Application Ser. No. 62/743,693, filed Oct. 10, 2018, and entitled "Compute-in-Memory Die Package and Method Forming Same;" which application is hereby incorporated herein by reference.

BACKGROUND

The packages of integrated circuits are becoming increasing complex, with more device dies integrated in the same package to achieve more functions. For example, System-on-Integrated-Chips (SoICs) have been developed to include a plurality of device dies such as processors and memory cubes in the same package. In the SoICs, device dies formed using different technologies and having different functions can be bonded in both 2D side-by-side and 3D stacking manner to form a system, with higher computing efficiency, bandwidth, functionality packing density, lower communication latency, and energy consumption per bit data.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 25 through 31 illustrate the cross-sectional views of intermediate stages in the formation of a package in accordance with some embodiments.

DETAILED DESCRIPTION

Figure 1:
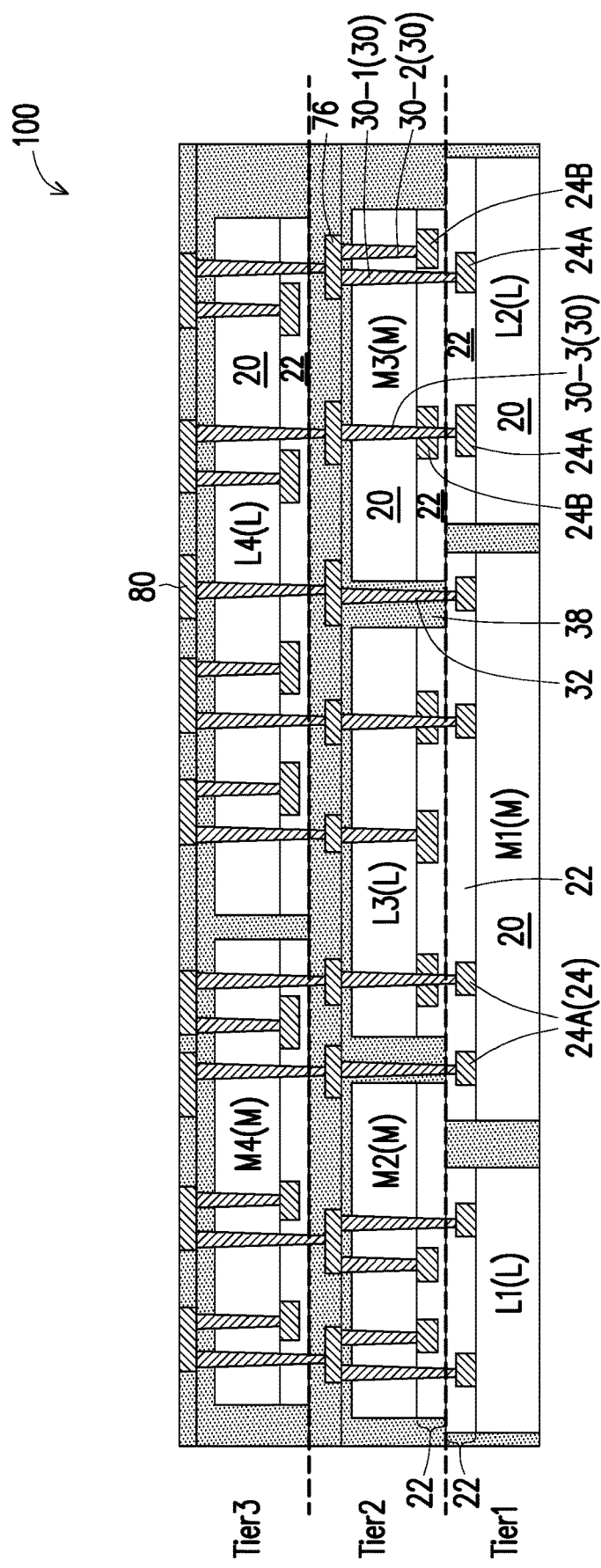
FIG. 1 illustrates a cross-sectional view of a package in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package and the method of forming the same are provided in accordance with various embodiments. The intermediate stages in the formation of the package are illustrated in accordance with some embodiments. Some variations of some embodiments are discussed. Throughout the various views and illustrative embodiments, like reference numbers are used to designate like elements. In accordance with some embodiments of the present disclosure, compute-in-memory packages are formed. A compute-in-memory package includes a plurality of tiers, with each of the tiers including both logic dies and memory dies. A logic die in a tier may be immersed in memory dies (and possibly other logic dies) that are in the same tier or in other ties that are over and/or under the tier. Similarly, a memory die in a tier may be immersed in logic dies (and possibly other memory dies) that are in the same tier or in other ties that are over and/or under the tier. With this setting, the computing efficiency may be improved, the bandwidth of the system may be increased, and the latency may be reduced due to the close proximity of the dies and the efficient layout.

FIG. 1 illustrates a cross-sectional view of compute-in-memory package 100. In accordance with some embodiments of the present disclosure, the term "compute-in-memory" refers to the structure that logic dies, which perform computing functions, are immersed in memory dies that the logic dies access. Compute-in-memory package 100 is also sometimes referred to as a System on Integrated Chip (SoIC) package. In FIG. 1 and subsequent figures, letter "L" is used to represent that the corresponding die is a logic die, and letter "M" is used to represent that the corresponding die is a memory die. The logic dies L and memory dies M may be followed by numbers for identification purpose. It is appreciated that FIG. 1 illustrates an example, and each of the dies as shown in FIG. 1 (and FIGS. 2 through 12) may be a logic die or a memory die in other embodiments. Furthermore, in each of tiers, the number of logic dies and the number of memory dies may be any numbers equal to or greater than 1, depending on the design requirement. It is appreciated that although three-tier packages are shown as examples, the compute-in-memory packages may include more than three tiers such as four tiers, five tiers, or more.

In accordance with some embodiments of the present disclosure, the logic dies include single-core dies or multi-core logic dies. The logic dies may be Application Processor (AP) dies, Graphics Processing Unit (GPU) dies, Field Programmable Gate Array (FPGA) dies, Application Specific Integrated Circuit (ASIC) dies, Input-Output (IO) dies, Network Processing Unit (NPU) dies, Tensor Processing Unit (TPU) dies, Artificial Intelligence (AI) engine dies, or the like. In compute-in-memory package 100, and possibly in each of the tiers, different types of logic dies may be mixed.

In accordance with some embodiments of the present disclosure, the memory dies may include Static Random Access Memory (SRAM) dies, Dynamic Random Access Memory (DRAM) dies, Wide I/O memory dies, NAND memory dies, Resistive Random Access Memory (RRAM) dies, Magneto-resistive Random Access Memory (MRAM) dies, or the like. The memory dies may include or may be free from controllers therein. The memory dies may also be in the form of single memory die or a pre-stacked memory cubes. In compute-in-memory package 100, and possibly in each of the tiers, different types of memory dies may be mixed.

Referring again to FIG. 1, there are tiers tier-1, tier-2 over tier-1, and tier-3 over tier-2 in accordance with some example embodiments. Neighboring tiers are bonded to each other, either through direct dielectric bonding (also sometimes referred to as dielectric-to-dielectric bonding or fusion bonding) or hybrid bonding. Hybrid bonding includes both dielectric-to-dielectric bonding and metal-to-metal bonding. Each of the tiers may include one or more logic die L and one or more memory die M. Logic dies L and memory dies M may include semiconductor substrates 20, which may be silicon substrates. Interconnect structures 22 are formed on the corresponding semiconductor substrates 20, and are used to interconnect the devices in the corresponding dies. Furthermore, bond pads 24 may be formed inside interconnect structure 22 or coplanar to the surfaces of the corresponding dies L or M.

Through-vias 30 (including 30-1, 30-2, and 30-3) are formed to penetrate through semiconductor substrates 20, and are used to electrically and signally couple dies L and M (either in different tiers or in the same tier) together. Through-vias 30 may be used in different ways to interconnect the dies in different tiers. For example, through-vias 30-1 and 30-2 are used in combination to interconnect a metal pad in logic die L2 (pad 24A) with memory M3 (pad 24B) through a metal pad 76 that is over and contacting through-vias 30-1 and 30-2. On the other hand, through-via 30-3 is used to connect a metal pad 24A in logic die L2 with a metal pad 24B in memory M3. Through-via 32, which penetrates through dielectric region 38, is used to connect memory die M1 (in tier 1) to top metal pad 80 through metal pad 76.

Figure 2:
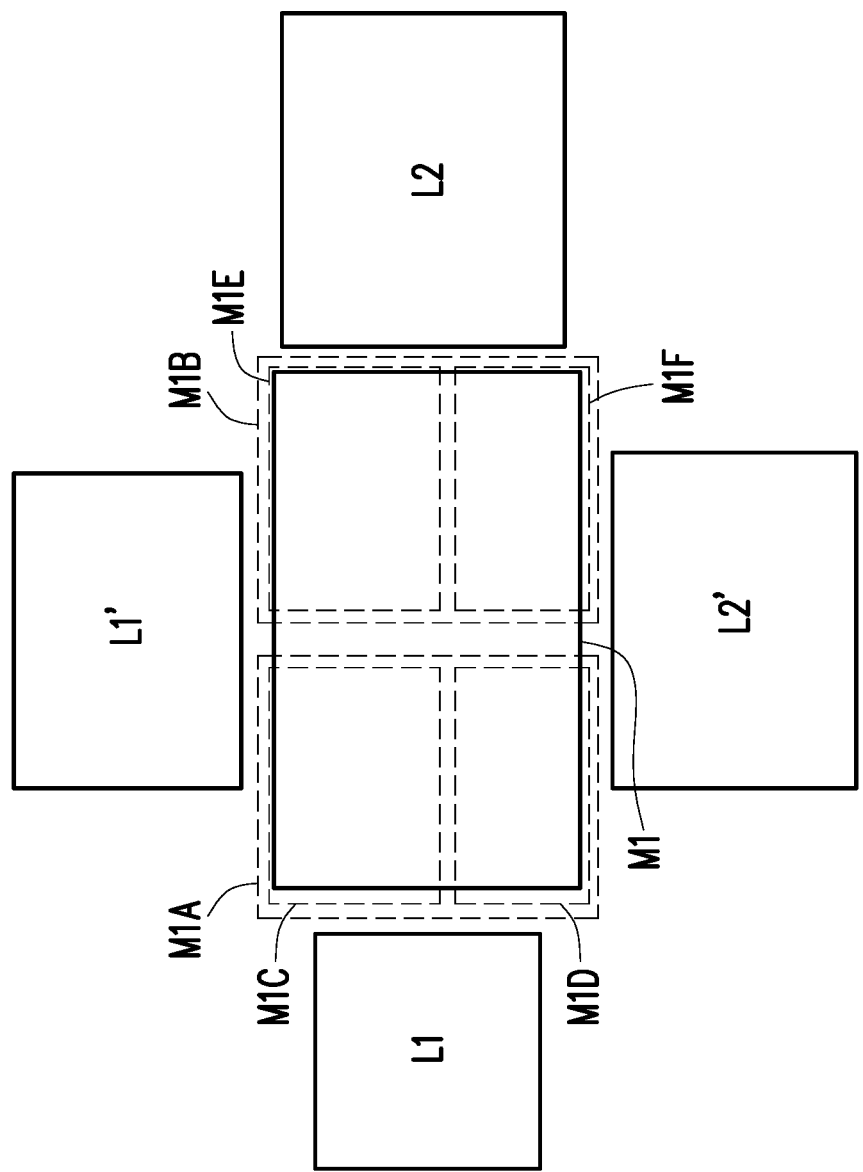
FIGS. 2, 3, and 4 illustrate top views of three tiers of a package in accordance with some embodiments.

FIG. 2 illustrates a top view of tier 1, wherein an example layout is illustrated. For example, the example embodiment includes memory die M1 surrounded by (immersed in) logic dies L1, L2, L1', and L2'. As aforementioned, the illustrated layout of tier 1 (and tier 2 as in FIG. 3 or tier 3 as in FIG. 4) is an example, and each of the illustrated dies L and M may also be a logic die or a memory die in other embodiments. In accordance with some embodiments, memory die M1 is a single memory die. In accordance with alternative embodiments, the illustrated memory die M1 represents a plurality of memory dies. For example, in accordance with some embodiments, memory dies M1A and M1B may be placed in the place of memory die M1. Memory dies M1A and M1B may be a same type of memory dies, or may be different types of memory dies. In accordance with alternative embodiments, memory dies M1C, M1D, M1E, and M1F may be placed in the place of memory die M1.

Figure 3:
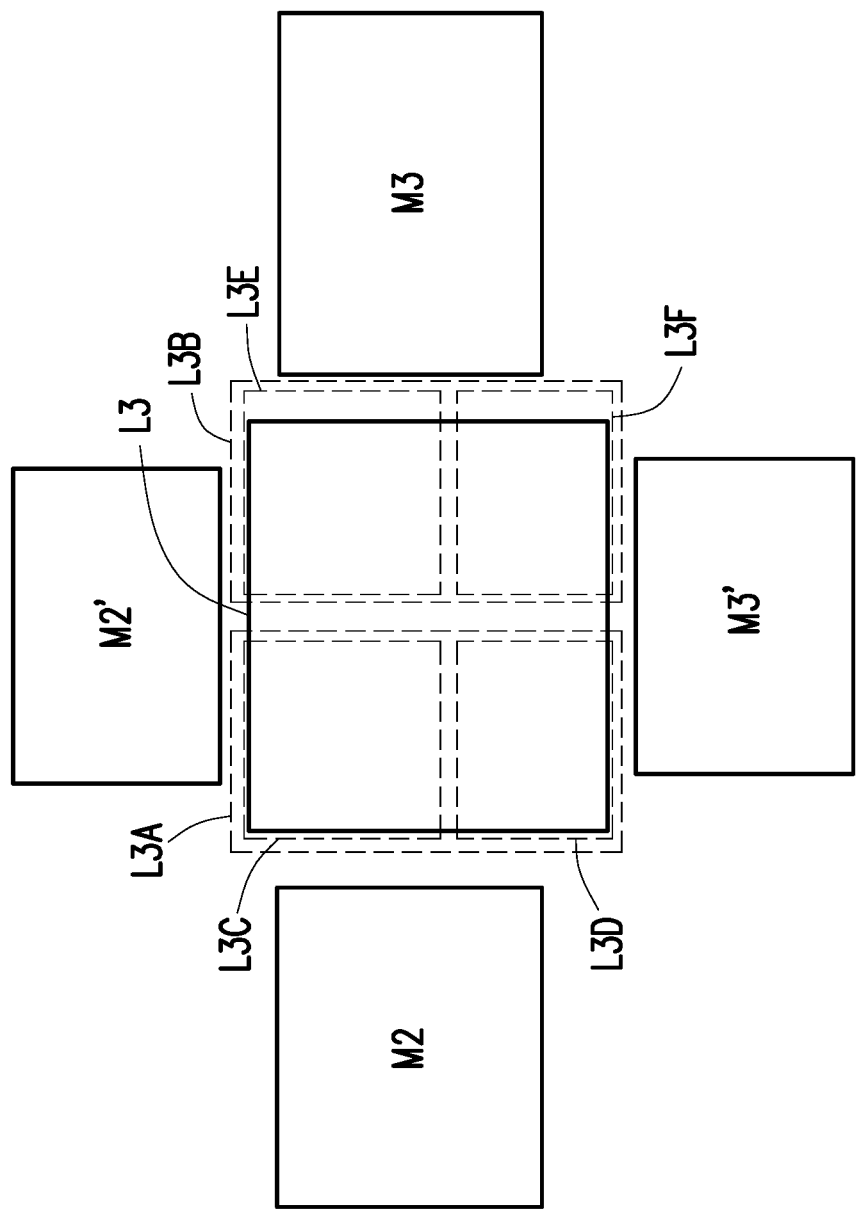

FIG. 3 illustrates a top view of tier 2, which includes logic die L3 surrounded by memory dies M2, M3, M2' and M3'. In accordance with some embodiments, logic die L3 is a single logic die. In accordance with alternative embodiments, the illustrated logic die L3 represents a plurality of logic dies. For example, in accordance with some embodiments, logic dies L3A and L3B may be placed in the place of logic die L3. Logic dies L3A and L3B may be a same type of logic dies, or may be different types of logic dies. In accordance with alternative embodiments, logic dies L3C, L3D, L3E, and L3F may be placed in the place of logic die L3.

Figure 4:
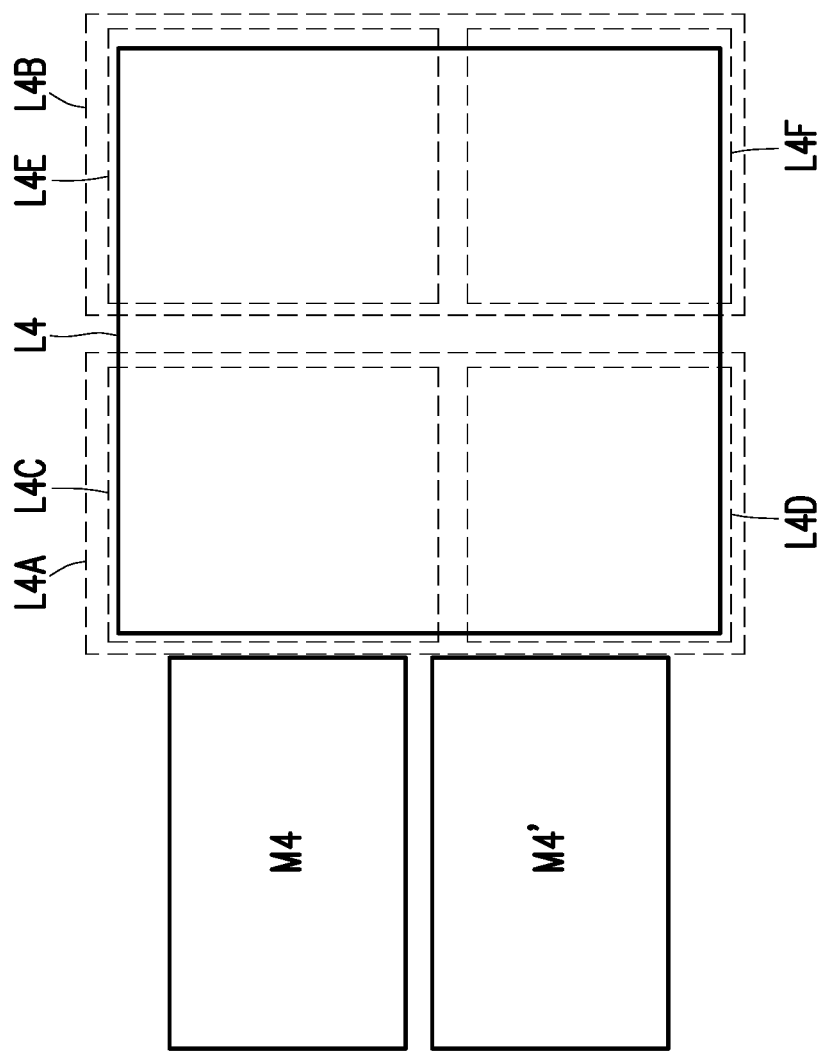

FIG. 4 illustrates a top view of tier 3, which includes logic die L4 on a side of memory dies M4 and M4'. In accordance with some embodiments, logic die L4 is a single logic die. In accordance with alternative embodiments, the illustrated logic die L4 represents a plurality of logic dies. For example, in accordance with some embodiments, logic dies L4A and L4B may be placed in the place of logic die L4. Logic dies L4A and L4B may be a same type of logic dies, or may be different types of logic dies. In accordance with alternative embodiments, logic dies L4C, L4D, L4E, and L4F may be placed in the place of logic die L4.

Figure 5:
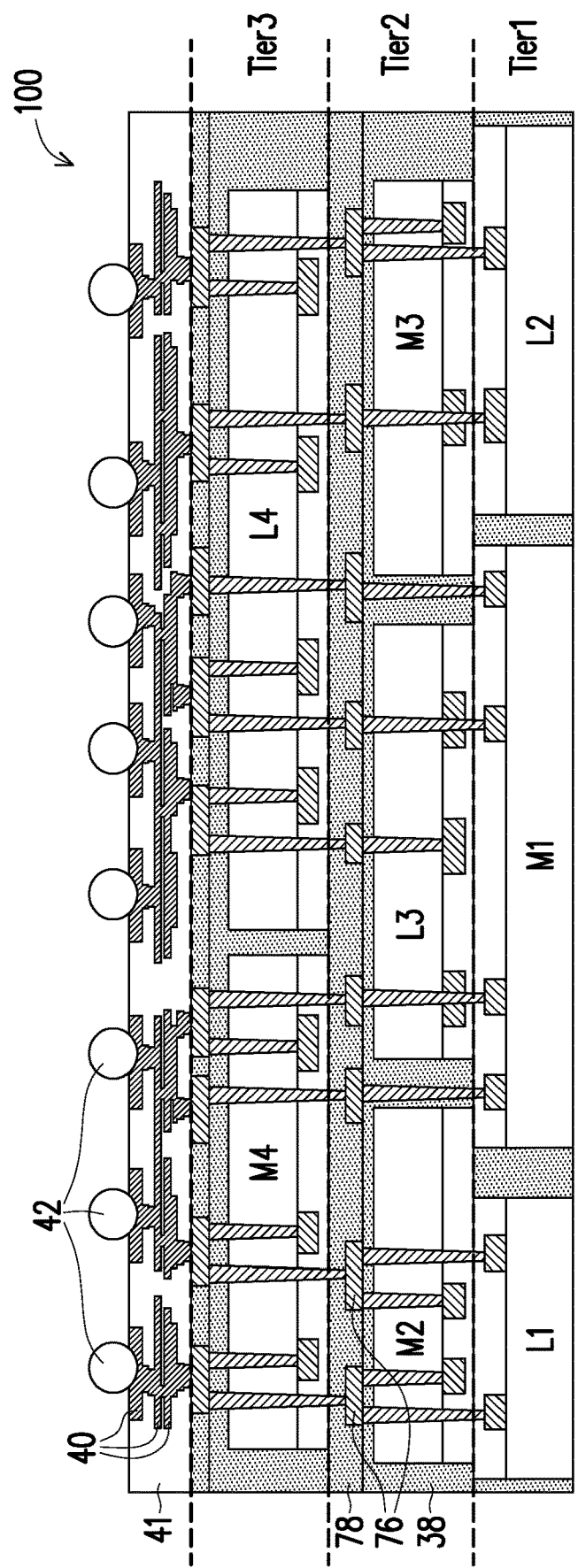
FIGS. 5 through 12 illustrate cross-sectional views of some packages in accordance with some embodiments.
Figure 10:
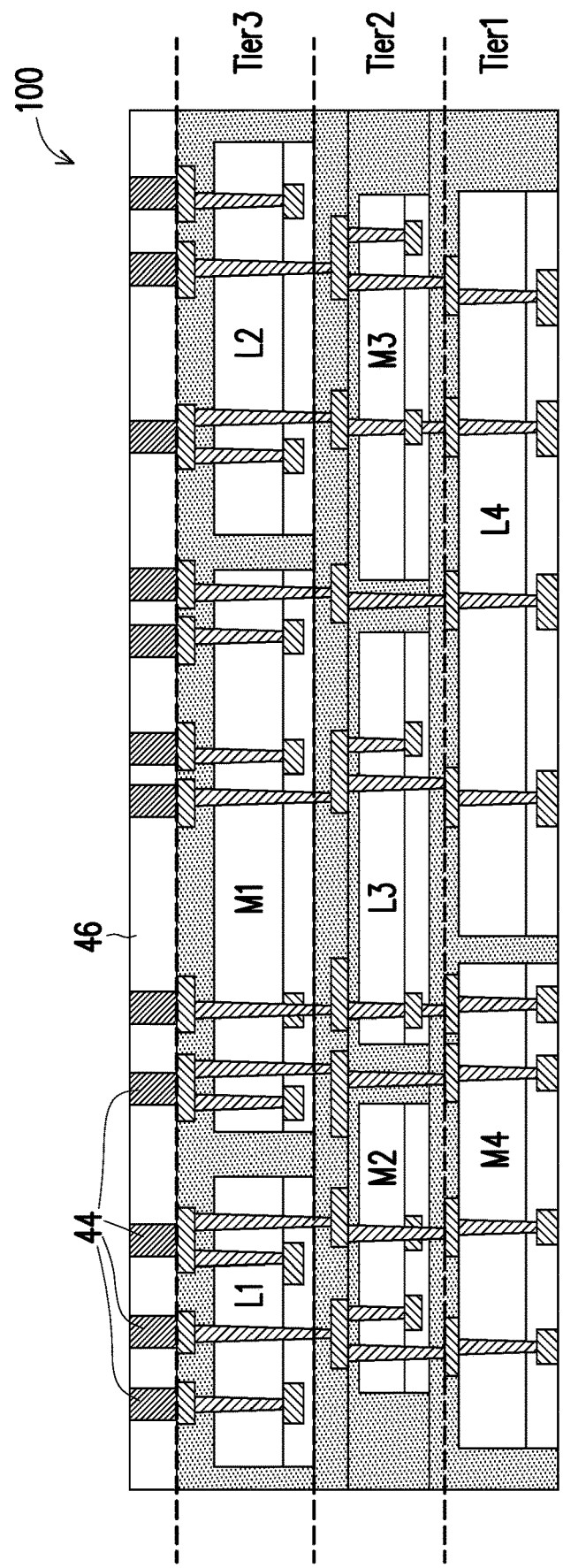
Figure 11:
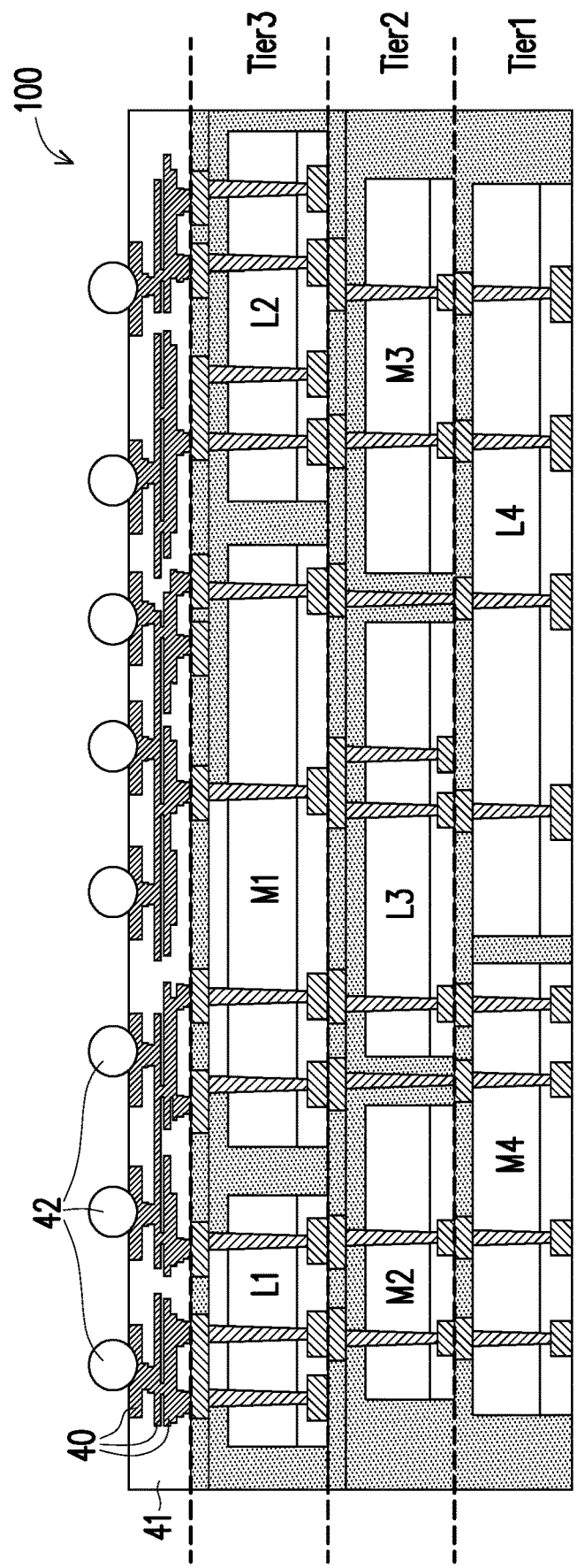
Figure 12:
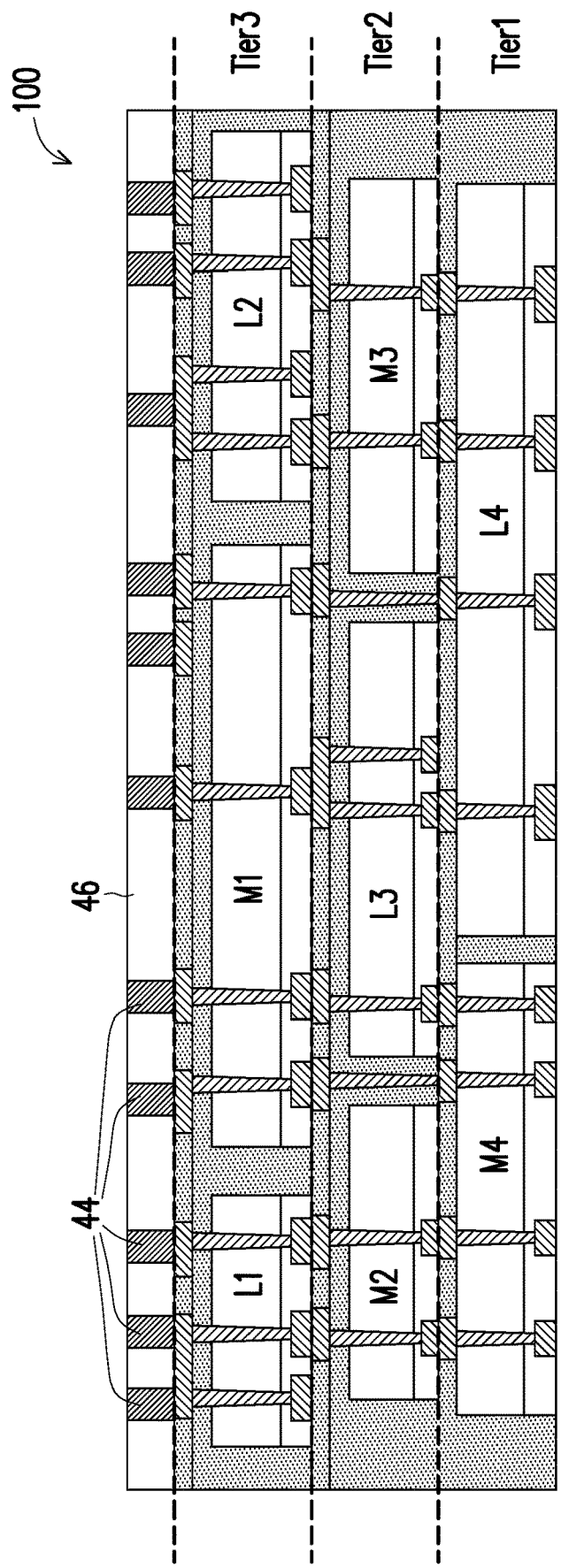

FIGS. 5 through 12 illustrate cross-sectional views of compute-in-memory packages in accordance with some embodiments. These embodiments include different combinations of arrangements of logic dies L and memory dies M, wherein dies L and M in different tiers may be arranged as facing up or facing down, and the bonding between neighboring tiers may be face-to-back bonding or face-to-face bonding. These embodiments also include different types of bonding methods including direct dielectric bonding and hybrid bonding. Also, the interfaces of the compute-in-memory packages may include Redistribution Lines (RDLs) and solder regions, or alternatively, include metal pillars. The RDLs and solder regions may be used for flip-chip bonding, and the metal pillars may be used for forming Integrated Fan-out (InFO) packages. It is appreciated that FIGS. 5 and 12 illustrate some example combinations, and other combinations are contemplated by the present disclosure. The embodiments shown in FIGS. 5 and 12 are also discussed in detail in the processes as shown in FIGS. 25 through 44.

Referring to FIG. 5, compute-in-memory package 100 includes dies in tier 1 being placed facing up. Throughout the description, when a die is referred to as being facing up, it means that the devices (such as active devices such as transistors or passive devices such as resistors, capacitors, or the like) are facing up toward the top surface of the respective semiconductor substrate in the die. Likewise, when a die is referred to as being facing down, it means that the devices are facing down toward the top surface of the respective substrate in the die. Tier-2 dies such as M2, L3, and M3 are placed facing down, and are bonded to the underlying tier-1 dies through direct dielectric bonding, and through face-to-face bonding. Tier-3 dies L4 and M4 are placed facing down, and are bonded to a dielectric layer 78 in tier 2 through direct dielectric bonding. Tier 3 dies L4 and M4 are bonded to the underlying tier-2 dies through face-to-back bonding. RDLs 40 are formed over tier 3 dies, and are electrically connected to tier-1, tier-2, and tier-3 dies through through-vias and metal pads. Solder regions 42 are formed over and electrically coupling to RDLs 40. Solder regions 42 may be used to bond compute-in-memory package 100 to other structures through flip-chip bonding.

Figure 6:
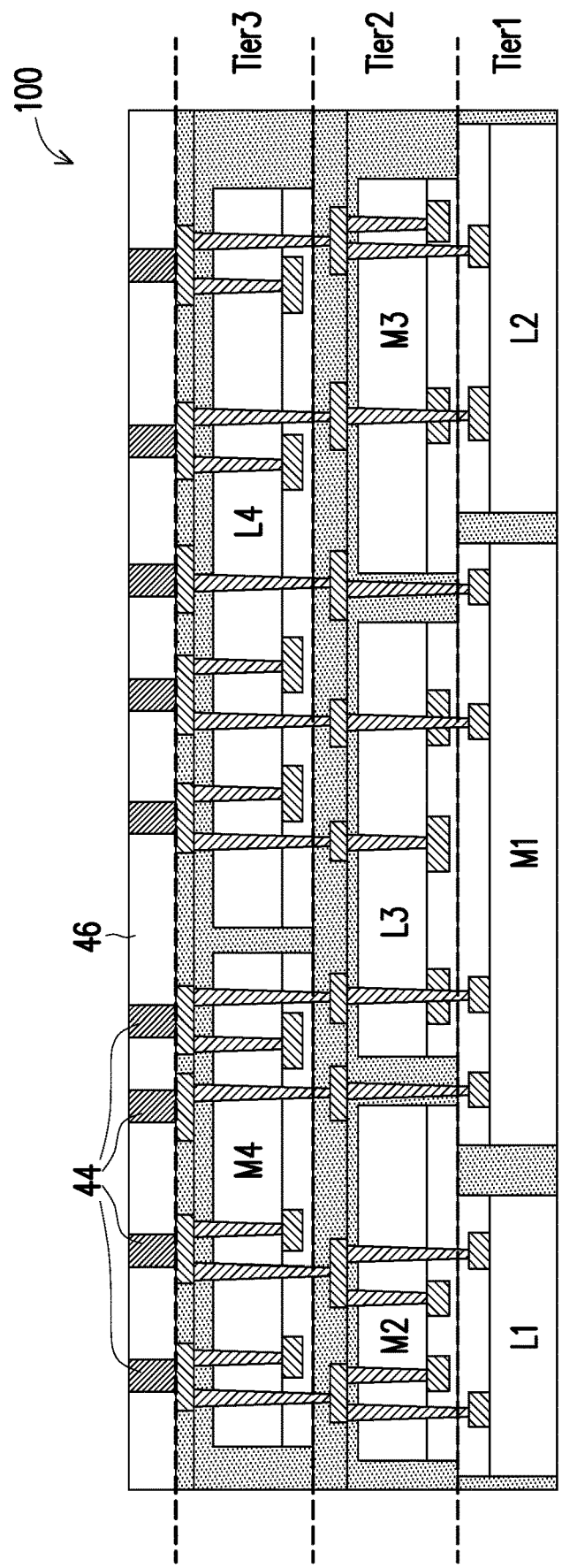

FIG. 6 illustrates compute-in-memory package 100 in accordance with some embodiments. These embodiments are similar to the embodiments in FIG. 5, except that over the tier-3 dies L4 and M4, metal pillars 44 are formed. Metal pillars 44 may be formed of copper, copper alloys, or other like metals. Dielectric layer 46 is formed to embed metal pillars 44 therein, and the top surface of dielectric layer 46 may be coplanar with the top surfaces of metal pillars 44. Dielectric layer 46 may be formed of a polymer such as polybenzoxazole (PBO), polyimide, benzocyclobutene (BCB), or the like. Dielectric layer 46 may also be formed of an inorganic dielectric material such as an oxide (silicon oxide or silicon oxynitride, for example).

Figure 7:
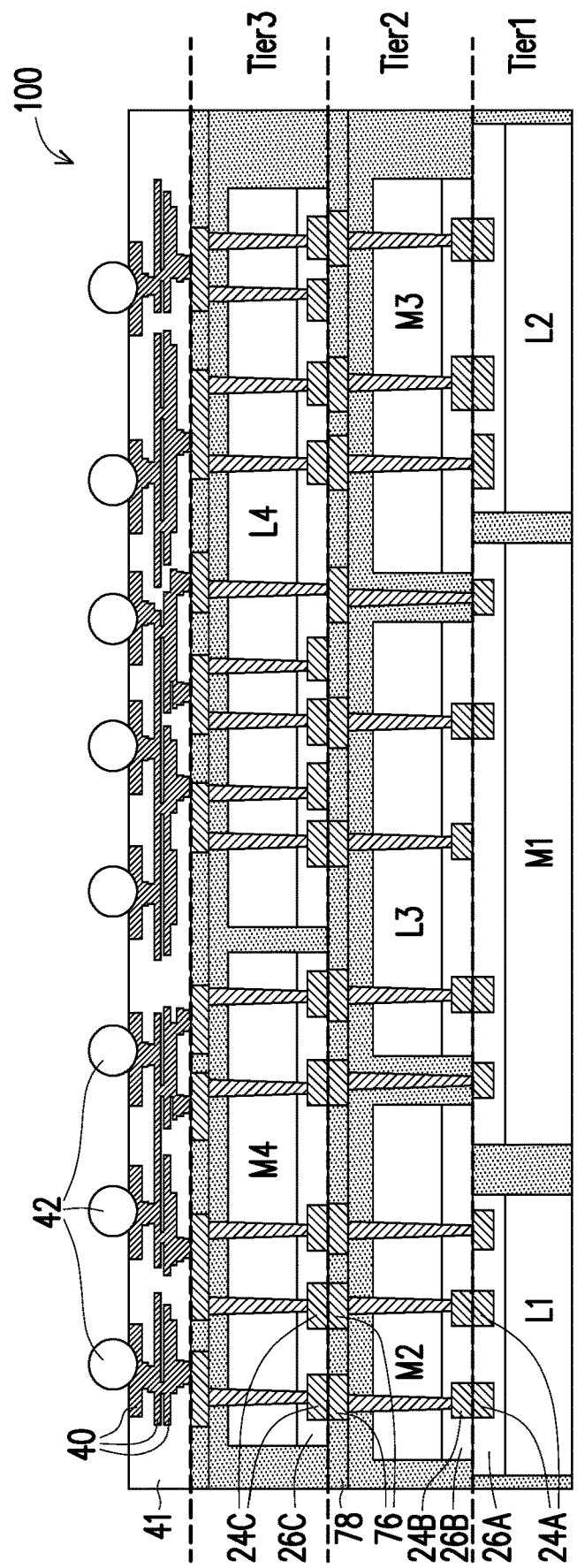

FIG. 7 illustrates compute-in-memory package 100 in accordance with some embodiments. These embodiments are similar to the embodiments in FIG. 5, except the bonding between neighboring tiers is hybrid bonding rather than direct dielectric bonding. For example, Dies L1 and M2 are bonded to each other through hybrid bonding, which includes the metal-to-metal bonding between metal pads 24A and 24B, and the dielectric-to-dielectric bonding between the surface dielectric layer 26A in die L1 and the surface dielectric layer 26B in die M2. Also, die M4 is bonded to the underlying dielectric layer 78 and metal pads 76 through hybrid bonding, which includes the bonding between dielectric layer 78 and the surface dielectric layer 26C in die M4, and the bonding between metal pads 24C in die M4 and metal pads 76. In the compute-in-memory package 100, RDLs 40 and solder regions 42 are formed for bonding compute-in-memory package 100 to other package components.

Figure 8:
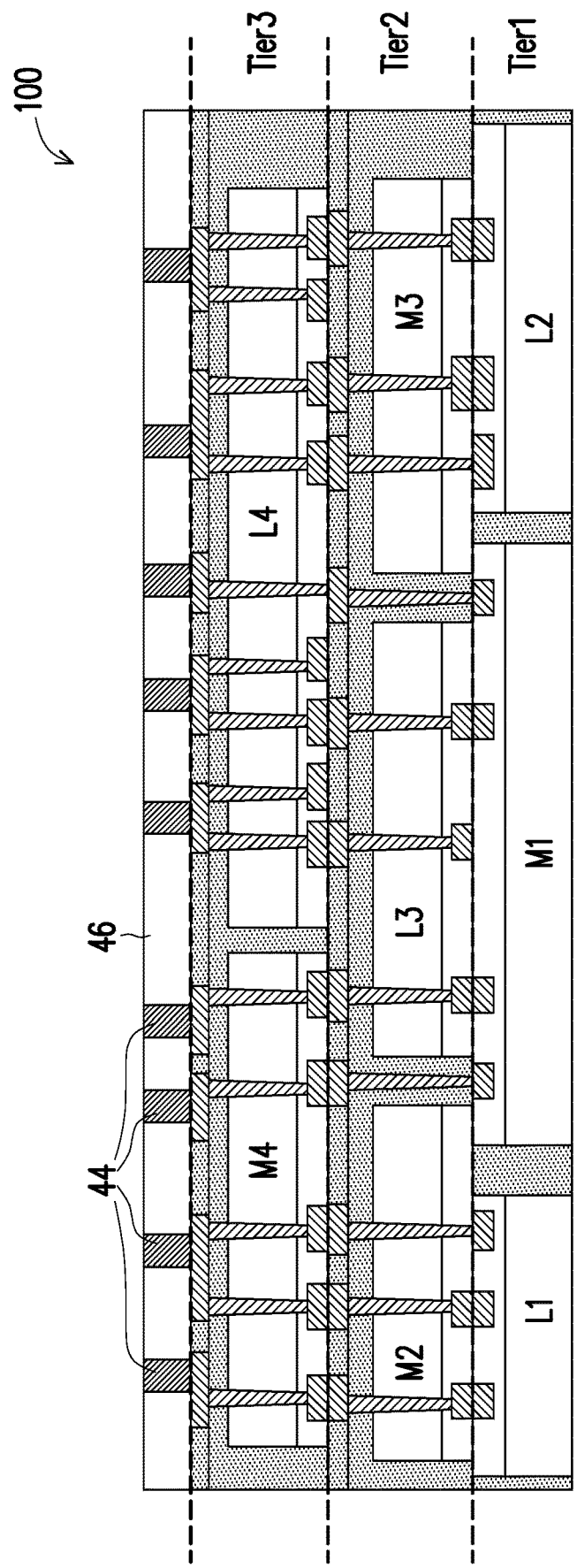

FIG. 8 illustrates compute-in-memory package 100 in accordance with some embodiments. These embodiments are similar to the embodiments in FIG. 7, except that over the tier-3 dies L4 and M4, metal pillars 44 are formed. Metal pillars 44 may be formed of copper, copper alloys, or other like metals. In the compute-in-memory package 100, metal pillars 44 are formed in dielectric layer 46 for bonding purpose, and the top surfaces of metal pillars 44 are coplanar with the top surface of dielectric layer 46.

Figure 9:
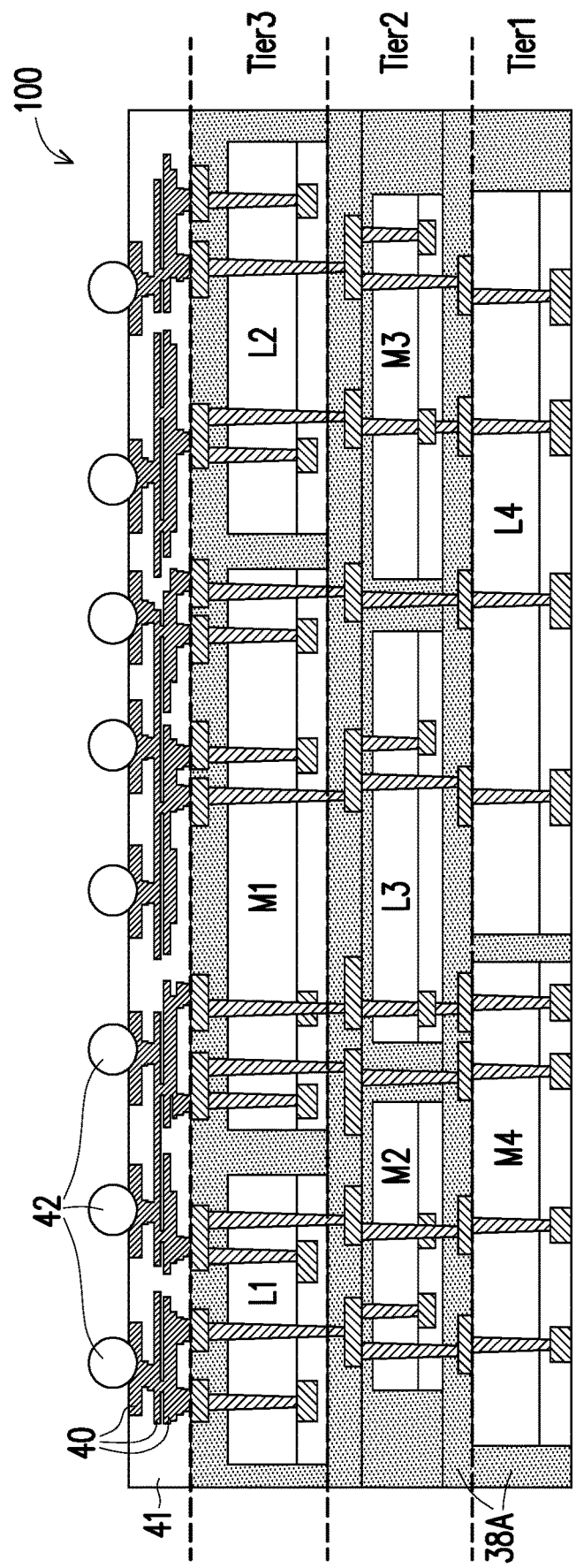

FIG. 9 illustrates compute-in-memory package 100 in accordance with some embodiments. These embodiments are similar to the embodiments in FIG. 5, except that dies are placed in inversed order, so that the tier-1 dies include dies L4 and M4, and tier-3 dies include dies L1, M2, and L2. It is realized, however, that the tier 1 dies may also include dies L1, M1, and L2 (rather than dies L4 and M4) as shown in preceding embodiments, and the tier 3 dies may also include dies L4 and M4 (rather than dies L1, M1, and L2). The tier-1 dies such as logic die L4 and memory die M4 are placed facing down, and the bonding of tier-2 dies such as logic die L3 and memory dies M2 and M3 to the tier-1 dies L4 and M4 is face-to-back bonding, which is achieved through direct dielectric bonding. For example, dies L3, M2, and M3 are bonded to the underlying dielectric layer 38A through direct dielectric bonding. Also, the tier-3 dies L1, M1, and L2 are bonded to the tier-2 dies through face-to-back bonding and through direct dielectric bonding. In the compute-in-memory package 100 as shown in FIG. 9, RDLs 40 and solder regions 42 are formed for bonding compute-in-memory package 100 to other package components.

FIG. 10 illustrates compute-in-memory package 100 in accordance with some embodiments. These embodiments are similar to the embodiments in FIG. 9, except that over the tier-3 dies L1, M1, and L2, metal pillars 44 are formed in dielectric layer 46 for bonding purpose, and the top surfaces of metal pillars 44 are coplanar with the top surface of dielectric layer 46.

FIG. 11 illustrates compute-in-memory package 100 in accordance with some embodiments. These embodiments are similar to the embodiments in FIG. 9, except tier-1 dies such as logic die L4 and memory die M4 are placed facing down, and the bonding of tier-2 dies such as logic die L3 and memory dies M2 and M3 to the tier-1 dies is through hybrid bonding, which is face-to-back bonding in accordance with some embodiments. Also, the tier-3 dies such as L1, M1, and L2 are also bonded to the tier-2 dies through face-to-back bonding and through hybrid bonding. In the compute-in-memory package 100, RDLs 40 and solder regions 42 are formed for bonding compute-in-memory package 100 to other package components.

FIG. 12 illustrates compute-in-memory package 100 in accordance with some embodiments. These embodiments are similar to the embodiments in FIG. 11, except that over the tier-3 dies L1, M1, and L2, metal pillars 44 are formed in dielectric layer 46 for bonding purpose, and the top surfaces of metal pillars 44 are coplanar with the top surface of dielectric layer 46.

The packages 100 as shown in FIGS. 5 through 12 are formed as reconstructed wafers, which include a plurality of packages having the structure shown in one of FIGS. 5 through 12. The corresponding wafer is then sawed so that the packages as shown in one of FIGS. 5 through 12 are formed as a discrete package 100.

FIGS. 13 through 24 illustrate some example embodiments to show how compute-in-memory packages 100 are used for forming larger packages or systems. In accordance with some of the embodiments, the compute-in-memory packages 100 as shown in FIGS. 5 through 12 are used similar to the usage of device dies. The details of the compute-in-memory packages 100 as shown in FIGS. 13 through 24 are not illustrated, and may be found referring to the embodiments shown in FIGS. 5 through 12. The surface bonding structures of compute-in-memory packages 100 are illustrated, which bonding structures indicate whether solder regions or metal pillars are adopted, depending on whether flip-chip bonding or InFO structure is used. Also, some of the bond pads and RDLs that are used for connecting to solder regions and/or metal pillars are not illustrated, and these bond pads and RDLs do exist in the packages. When more than one compute-in-memory package 100 exist in the same package, a letter "A" or "B" may be added to the reference numeral "100" to identify individual package 100.

Figure 13:
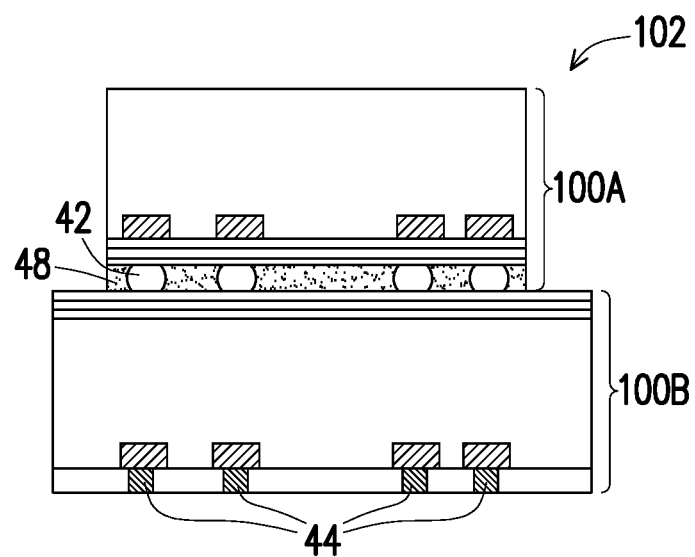
FIGS. 13 through 24 illustrate cross-sectional views of the systems incorporating packages therein in accordance with some embodiments.

FIG. 13 illustrates a face-to-back bonding of compute-in-memory packages 100A and 100B. The bonding is through flip-chip bonding, with underfill 48 disposed between compute-in-memory packages 100A and 100B. The resulting package 102 has metal pillars 44 at its surface. Accordingly, package 102 can be used to form an InFO package.

Figure 14:
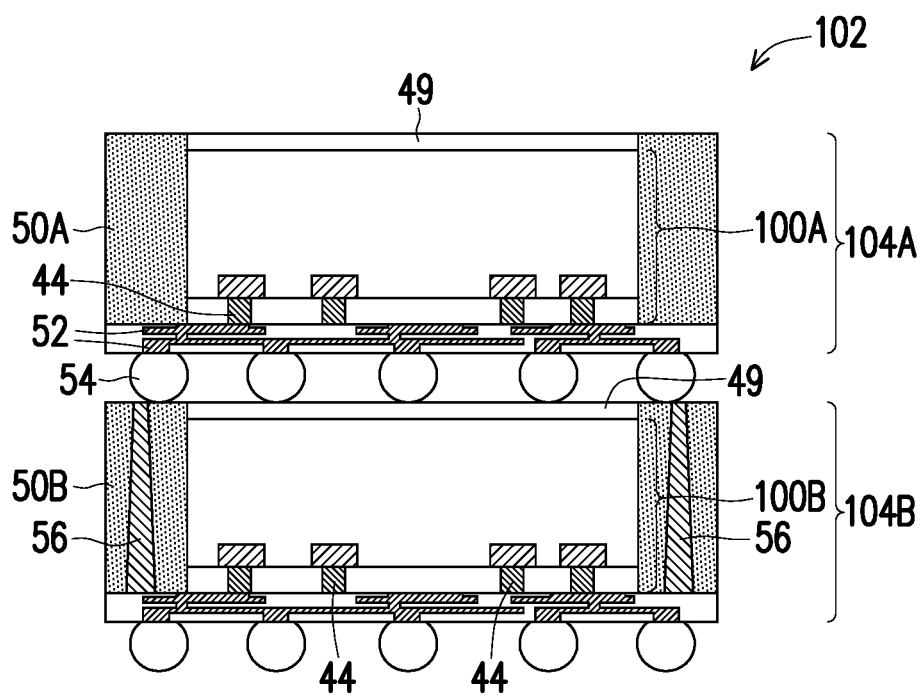

FIG. 14 illustrates package 102 that includes two packages 104A bonded to package 104B through flip-chip bonding. Packages 104A and 104B are InFO packages. In accordance with some embodiments of the present disclosure, the formation of InFO package 104A includes placing the corresponding compute-in-memory package 100A over a carrier (not shown) through die-attach film 49 (an adhesive film), encapsulating the compute-in-memory package 100A in an encapsulant 50A such as a molding compound, performing a planarization to level surfaces (the illustrated bottom surface) of the metal pillars 44 in the compute-in-memory package 100A with a surface of the encapsulant 50A, and then forming RDLs 52 and solder regions 54. Package 104B is formed similarly, except additional through-vias 56 are formed before encapsulant 50B is applied. The package 102 as shown in FIG. 14 may be used for flip-chip bonding.

Figure 15:
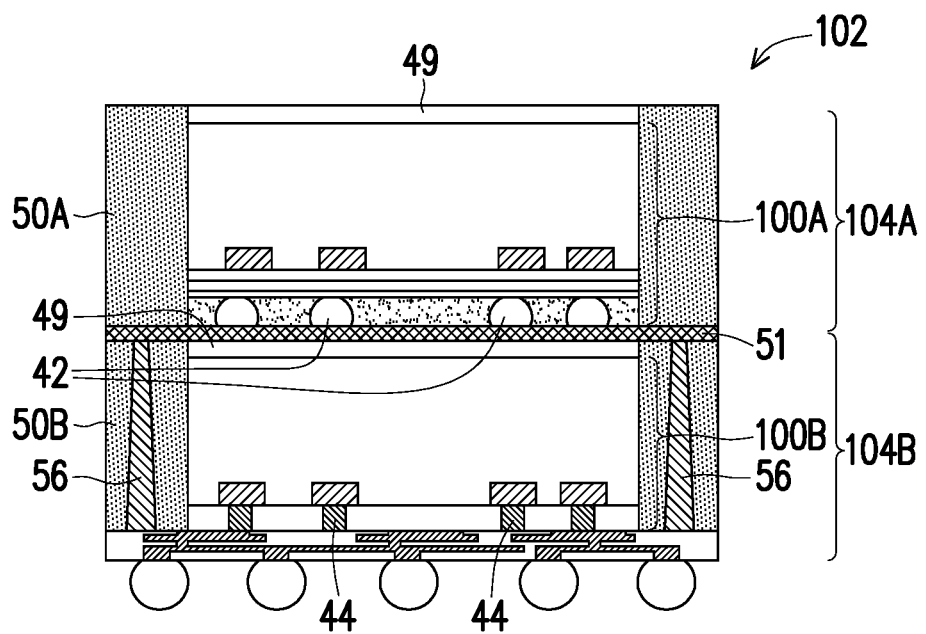

FIG. 15 illustrates a chip-on-package structure, in which compute-in-memory package 100B is used to form InFO package 104B first, followed by the bonding of compute-in-memory package 100A (used as a chip) to InFO package 104B through flip-chip bonding. Encapsulant 50A is then dispensed to encapsulate compute-in-memory package 100A therein. The package 102 as shown in FIG. 15 may be used for flip-chip bonding. RDLs 51 are formed as a part of package 104B. The details of RDLs 51 are not illustrated.

Figure 16:
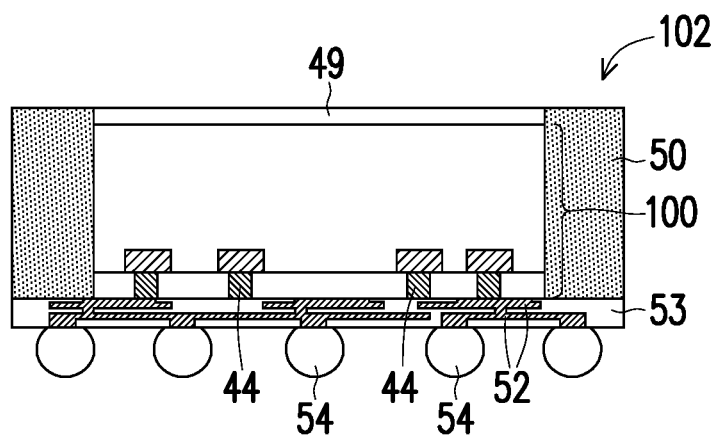

FIG. 16 illustrates package 102, which is an InFO package formed based on compute-in-memory package 100. The formation process has been described referring to the package 104A in FIG. 14, and the details are not repeated herein. The packaging process for forming the package 102 as shown in FIG. 16 is an RDL-last process, in which compute-in-memory package 100 is encapsulated in encapsulant 50 first, and the formation of RDLs 52 and the corresponding dielectric layers 53 is performed after the encapsulation of compute-in-memory package 100 in encapsulant 50.

Figure 17:
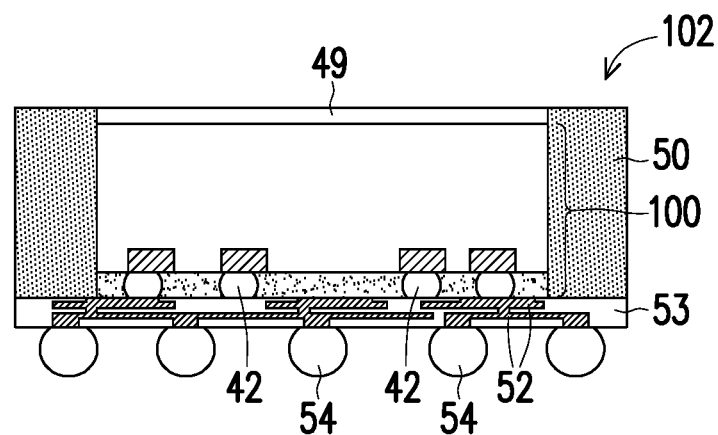

FIG. 17 illustrates package 102, which is a flip-chip package formed based on compute-in-memory package 100. The packaging process for forming the 102 as shown in FIG. 16 is an RDL-first process, in which RDLs 52 and the corresponding dielectric layer 53 are formed first, and compute-in-memory package 100 is bonded to RDLs 52 through flip-chip bonding. Compute-in-memory package 100 is then encapsulated in encapsulant 50.

Figure 18:
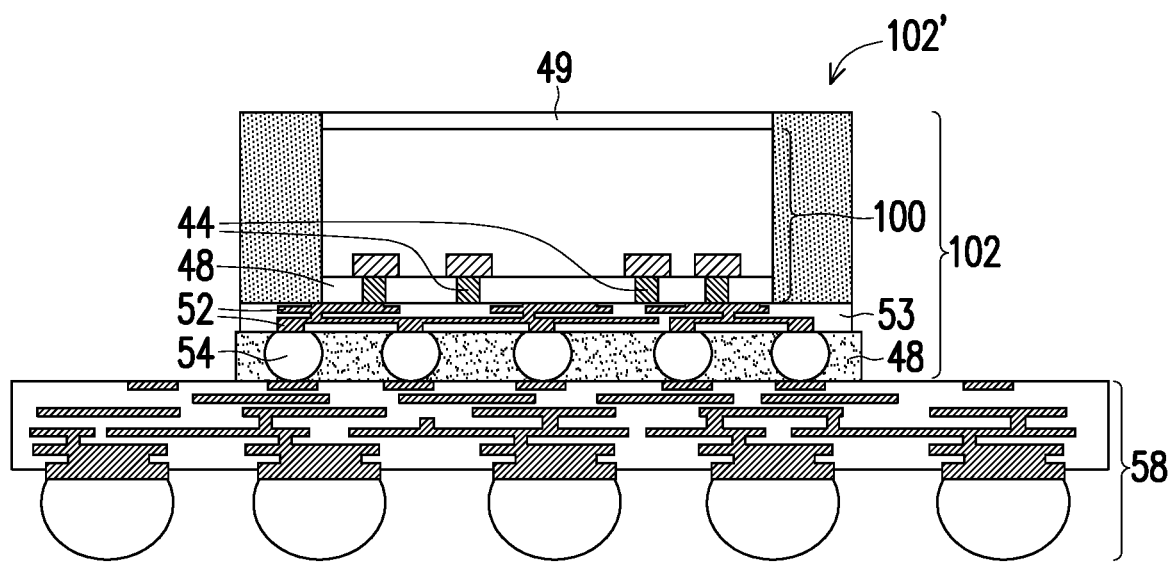

FIG. 18 illustrates package 102', which includes the package 102 as shown in FIG. 16 bonded to package substrate 58. Package substrate 58 may be a coreless substrate. Alternatively, package substrate 58 includes a core, and RDLs are formed on the opposite sides of the core. Underfill 48 is disposed between package 102 and package substrate 58.

Figure 19:
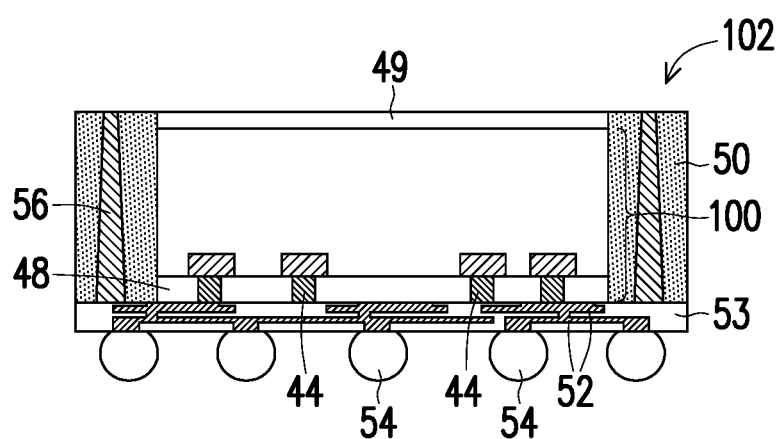

FIG. 19 illustrates package 102, which is an InFO package formed based on compute-in-memory package 100. The formation process has been described referring to the package 104B in FIG. 14, and the details are not repeated herein. The packaging process for forming the package 102 as shown in FIG. 19 is also an RDL-last process.

Figure 20:
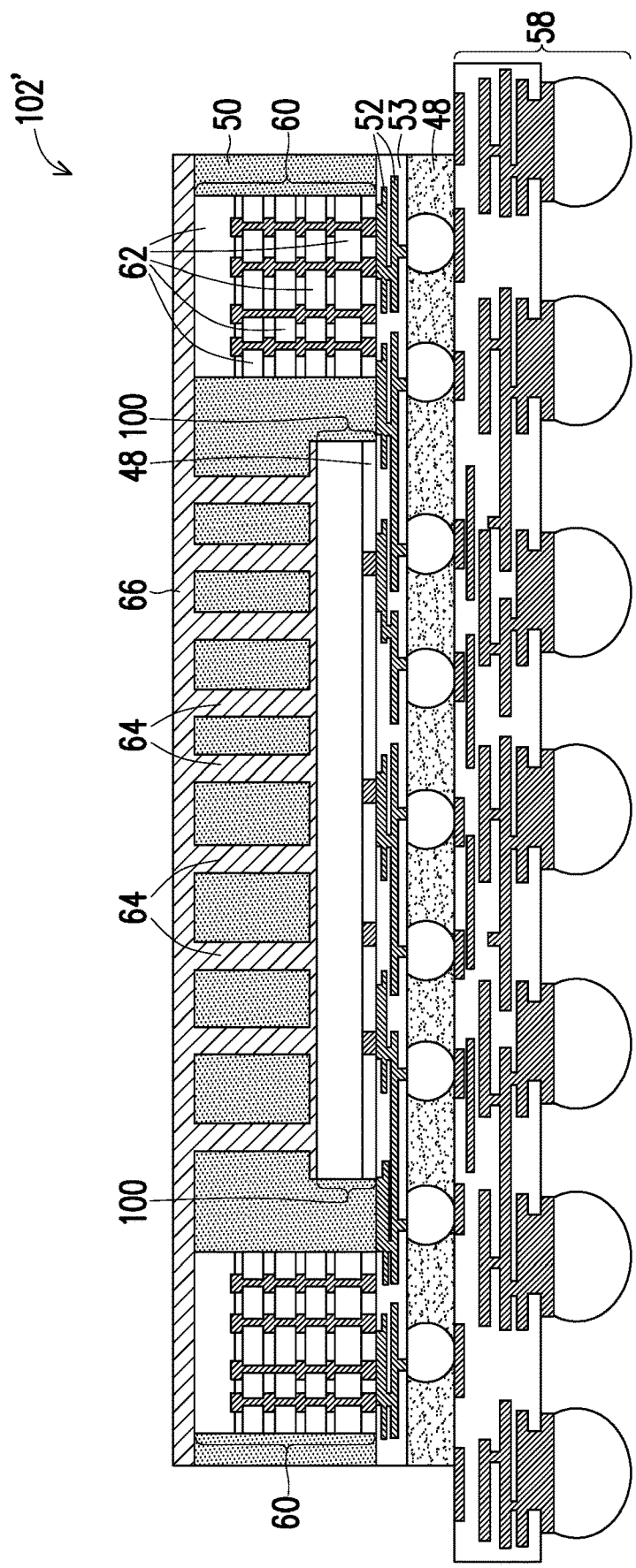

FIG. 20 illustrates package 102', which includes compute-in-memory package 100 and memory stacks (cubes) 60 forming an InFO package. Each of memory stacks 60 includes a plurality of memory dies 62 stacked and electrically inter-coupled. Memory stacks 60 may be High Bandwidth Memory (HBM) cubes. Memory stacks 60 and compute-in-memory package 100 are encapsulated in encapsulant 50. RDLs 52 are formed to connect to memory stacks 60 and compute-in-memory package 100. In accordance with some embodiments of the present disclosure, the corresponding package is a high-performance package. Accordingly, heat dissipation features 64 and metal lid 66 may be formed to connect to compute-in-memory package 100. Heat dissipation features 64 may be metal rods, metal fins, or the like. The InFO package is further bonded to package substrate 58.

Figure 21:
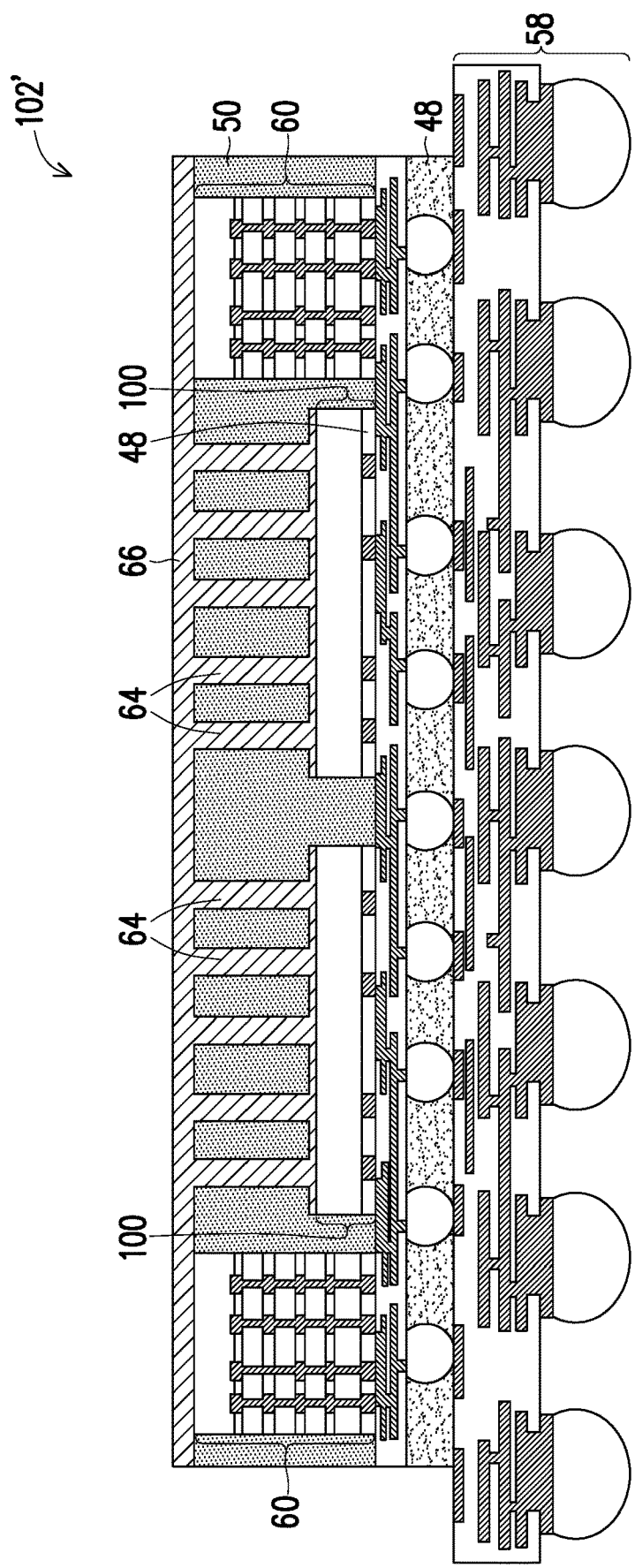

FIG. 21 illustrates package 102' in accordance with some embodiments of the present disclosure. These embodiments are similar to the embodiments as shown in FIG. 20, except that two compute-in-memory packages 100 are illustrated. It is appreciated that although two compute-in-memory packages 100 are illustrated, there may be more (such as four, six, eight, etc.) compute-in-memory packages 100. Similarly, in FIGS. 20 and 21, two memory stacks 60 are illustrated, while in the corresponding package 102', there may be more (such as four, six, eight, etc.) memory stacks 60.

Figure 22:
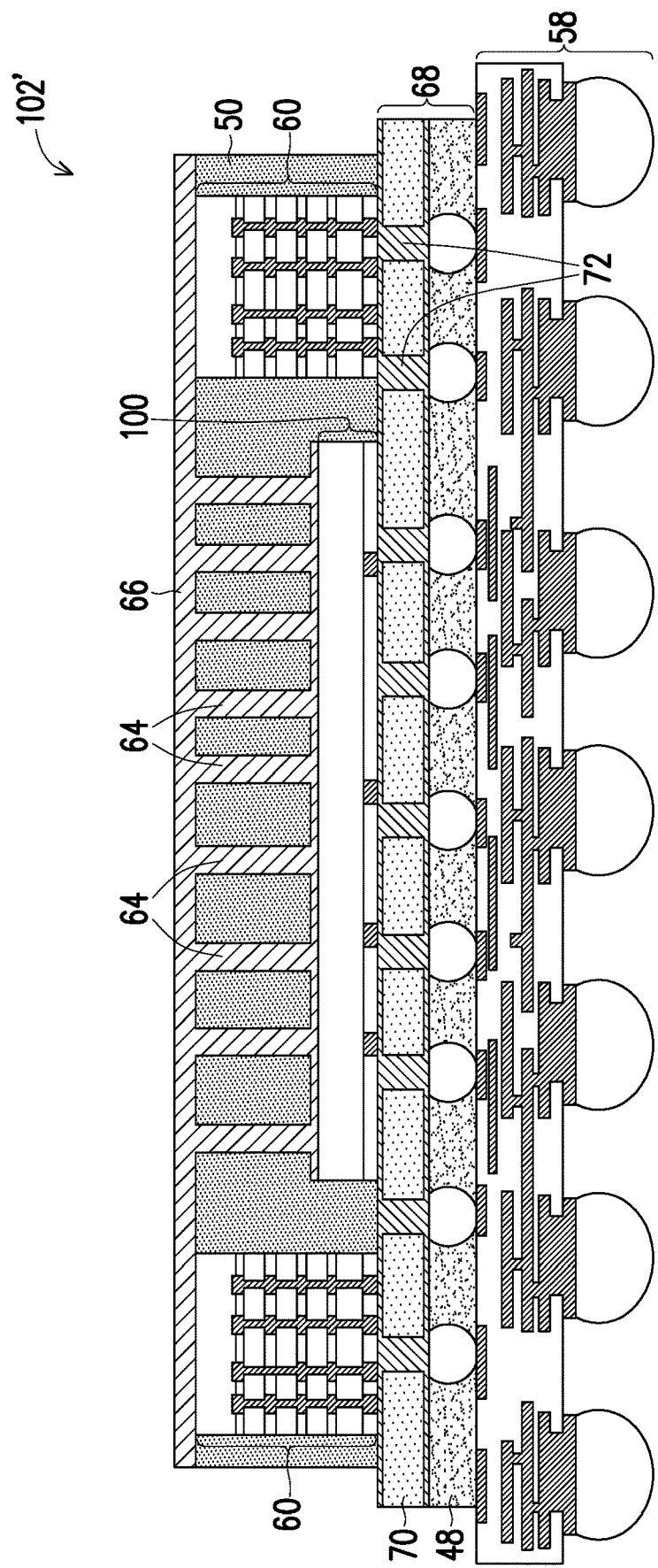

FIG. 22 illustrates package 102' in accordance with some embodiments of the present disclosure. These embodiments are similar to the embodiments as shown in FIG. 20, except that instead of forming RDLs 52 (FIG. 20) on the encapsulated compute-in-memory package 100, compute-in-memory package 100 is bonded to interposer 68. Interposer 68 includes a substrate 70, which may be a semiconductor substrate such as a silicon substrate, and through-vias 72 penetrating through substrate 70. RDLs are formed on the opposite sides of substrate 70, and are interconnected through through-vias 72.

Figure 23:
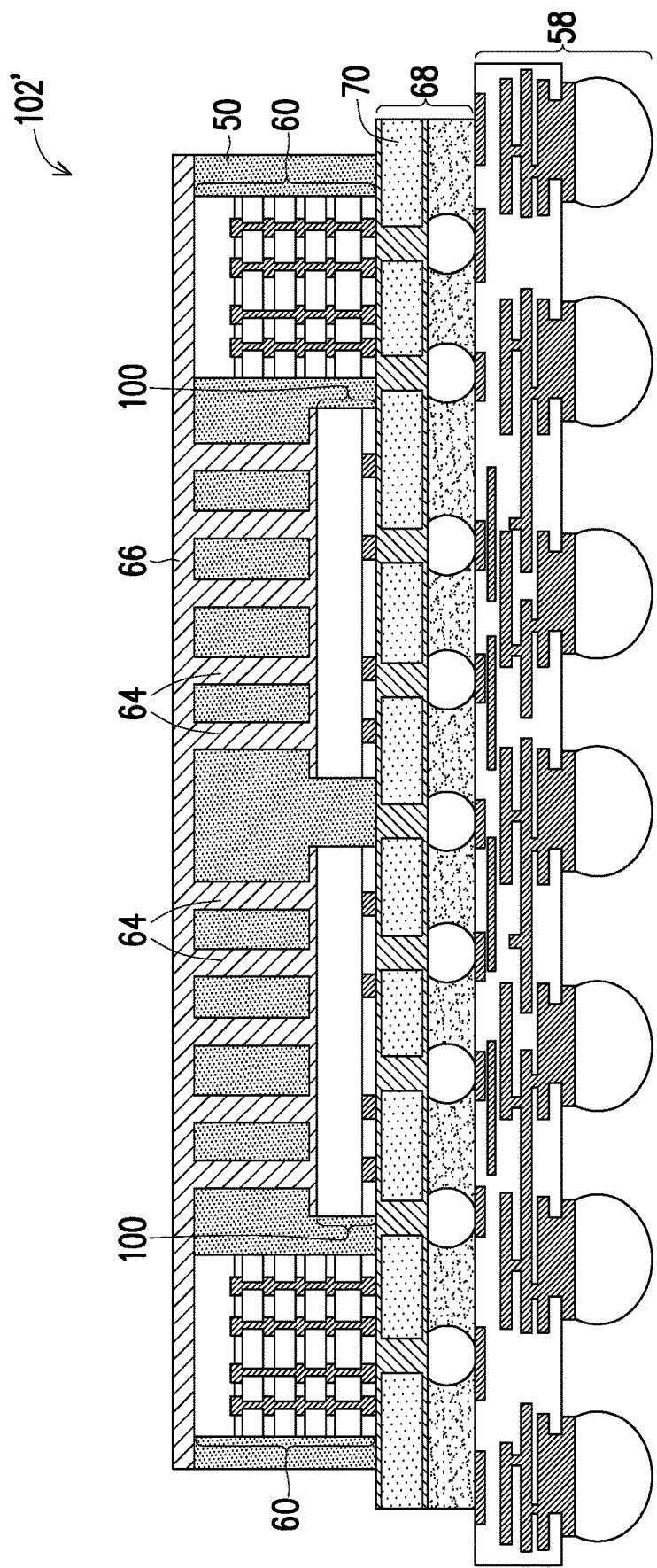

FIG. 23 illustrates package 102' in accordance with some embodiments of the present disclosure. The package 102' is similar to the embodiments shown in FIG. 22, except two compute-in-memory packages 100 are illustrated.

Figure 24:
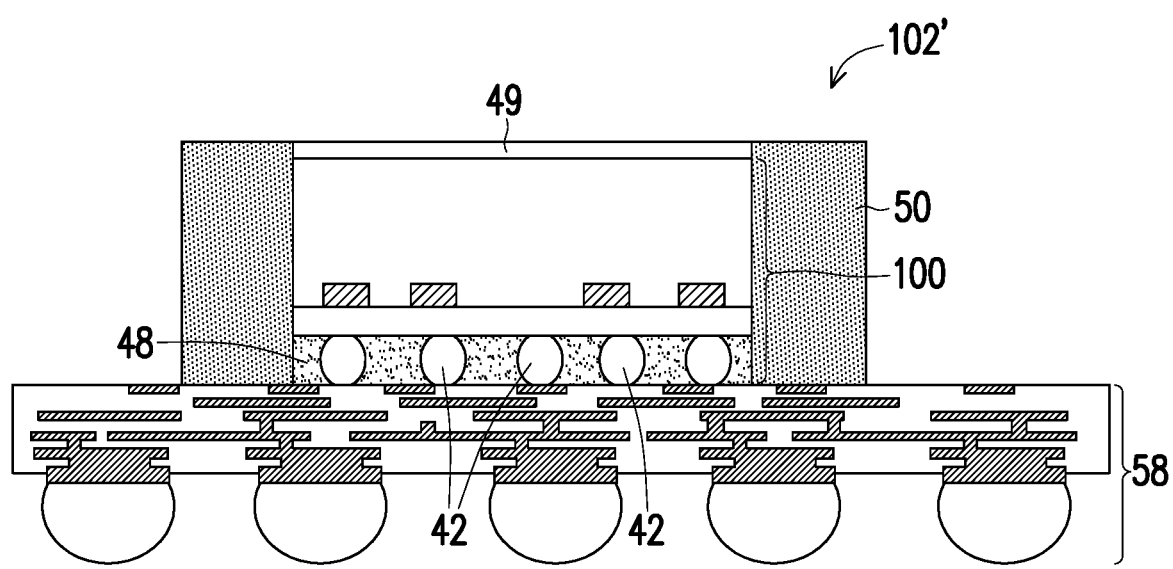

FIG. 24 illustrates package 102' in accordance with some embodiments of the present disclosure, in which compute-in-memory package 100 is bonded to package substrate 58 through flip-chip bonding. Underfill 48 is disposed in the gap between compute-in-memory package 100 and package substrate 58. Encapsulant 50 is encapsulated on compute-in-memory package 100.

Figure 45:
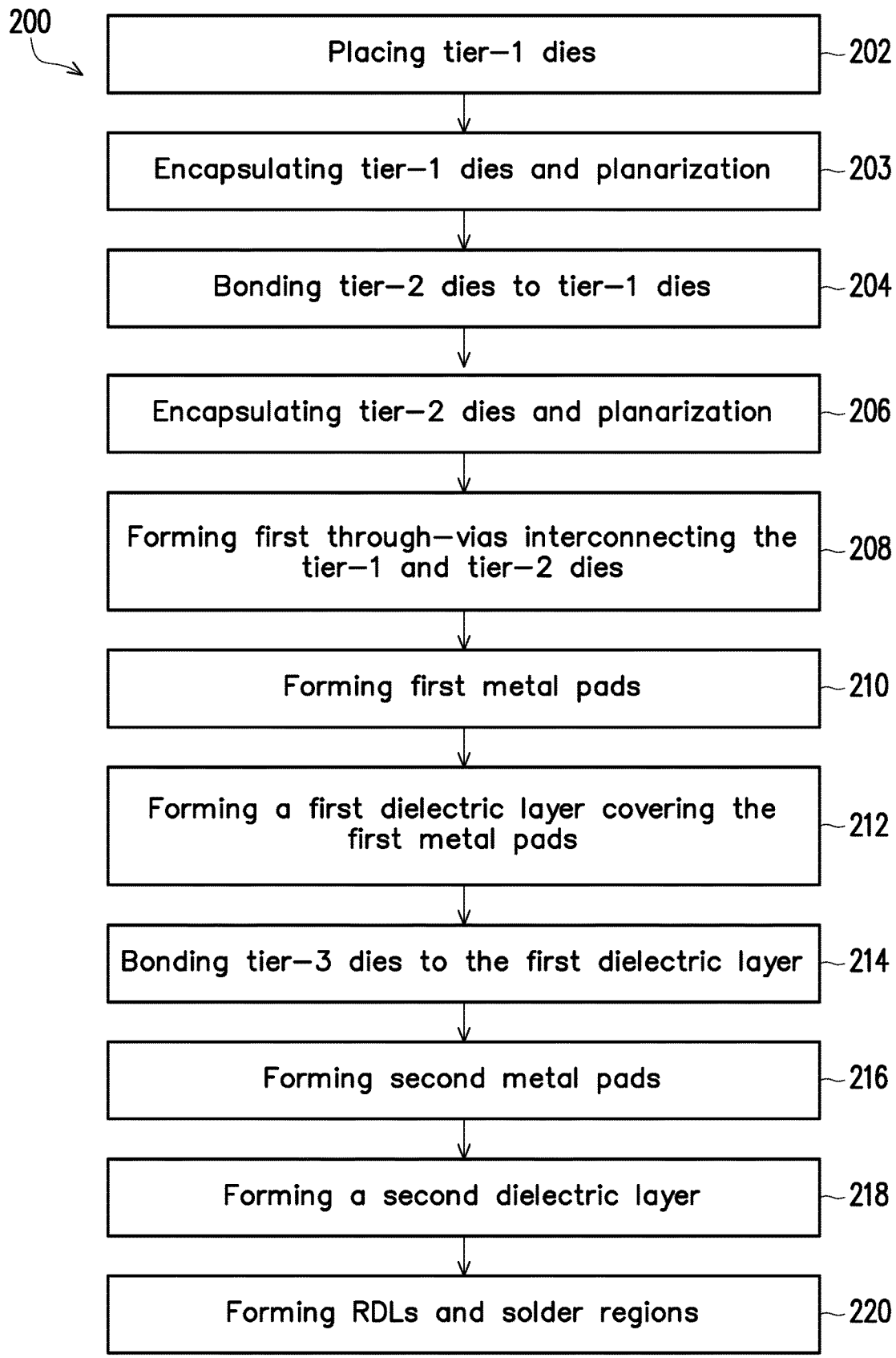
FIG. 45 illustrates a process flow for forming a package in accordance with some embodiments.

FIGS. 25 through 31 illustrate the cross-sectional views of intermediate stages in the formation of compute-in-memory packages 100 as shown in FIG. 5 in accordance with some embodiments of the present disclosure. The corresponding processes are also reflected schematically in the process flow shown in FIG. 45.

Referring to FIG. 25, tier-1 dies such as logic dies L1 and L2 and memory die M1 are placed on carrier 74, for example, through die-attach films (not shown). The respective process is illustrated as process 202 in the process flow shown in FIG. 45. The front sides of the tier-1 dies face up. Metal pads 24A in the tier-1 dies are covered by the corresponding dielectric layers 26A. In accordance with some embodiments of the present disclosure, dielectric layers 26A are formed of oxides such as silicon oxide, silicon oxynitride, silicon carbo-nitride, or the like. The gap between tier-1 dies L1, L2, and M1 is then filled with dielectrics film 38A with a further surface planarization process. Dielectric film may be formed of an oxide (such as silicon oxide), SiCN, SiN, SiOC, or the like. The respective process is illustrated as process 203 in the process flow shown in FIG. 45.

Next, as shown in FIG. 26, tier-2 dies such as logic die L3 and memory dies M2 and M3 are bonded to the tier-1 dies L1, L2, and M1 through direct dielectric bonding, with dielectric layers 26B bonded to the corresponding dielectric layers 26A through fusion bonding. The respective process is illustrated as process 204 in the process flow shown in FIG. 45. Some of the dies such as die M3 may be bonded to more than one die (such as dies M1 and L2). In accordance with some embodiments, there is no direct electrical connection between die M3 and die M1. The bonding stability, however, is improved due to the bonding of dies M3 onto both dies L2 and M1. After the bonding, the tier-2 dies may be thinned.

Figure 27:
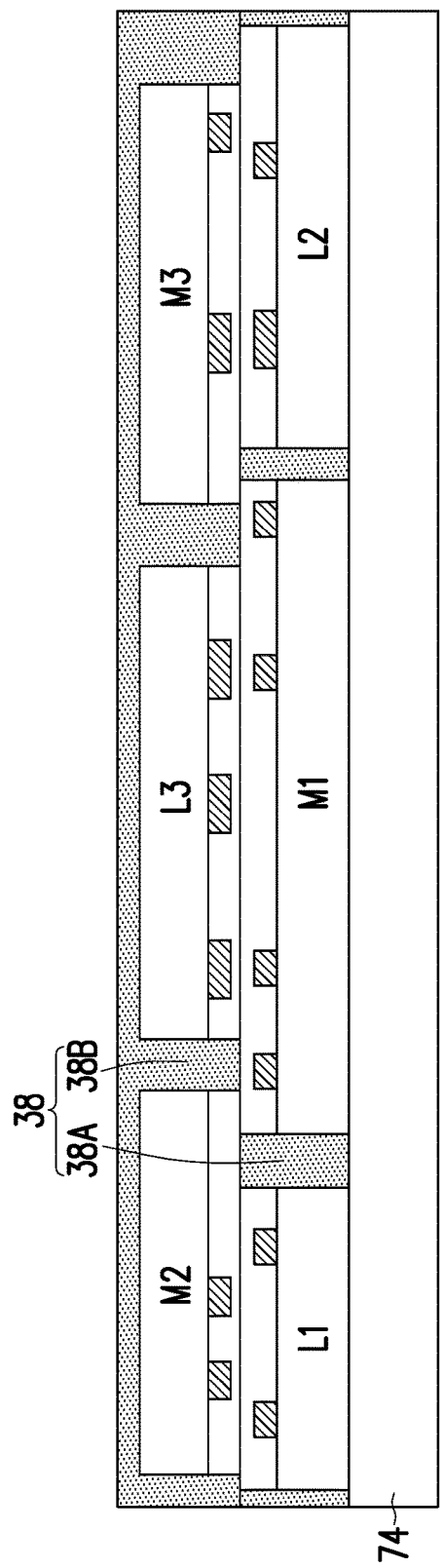

Next, as shown in FIG. 27, a gap-filling process is performed, and dielectric region 38B is formed to fill the gaps as shown in FIG. 26. The respective process is illustrated as process 206 in the process flow shown in FIG. 45. The gap-filling may be performed using applicable methods including, and not limited to, Chemical Vapor Deposition (CVD), spin coating, Flowable Chemical Vapor Deposition (FCVD), or the like. Dielectric region 38B may be formed of an oxide (such as silicon oxide), SiCN, SiN, SiOC, or the like. A planarization process such as a Chemical Mechanical Polish (CMP) process or a mechanical grinding process may be performed to level the top surface of dielectric region 38B. In accordance with alternative embodiments, the tier-1 dies and the tier-2 dies are encapsulated in a same encapsulating process, in which dielectric regions 38A and 38B form a continuous dielectric region, which is referred to as dielectric region 38.

Figure 28:
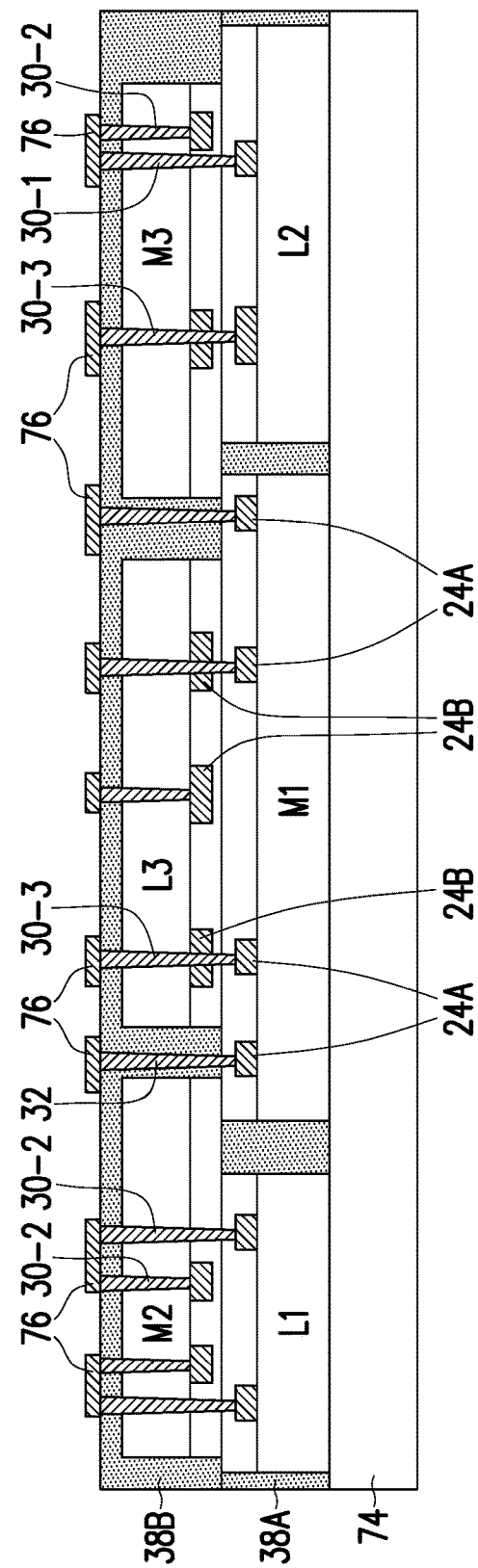

FIG. 28 further illustrates the formation of through-vias 30 (including 30-1, 30-2, and 30-3), which penetrate through dielectric region 38 and the substrates (such as silicon substrates or other types of semiconductor substrates) in the tier-2 dies to electrically couple to metal pads 24A. The respective process is illustrated as process 208 in the process flow shown in FIG. 45. Accordingly, the tier-1 dies are electrically coupled to tier-2 dies. The electrical coupling of metal pads 24B to the corresponding metal pads 24A may be through a single through-via 30-3, or through two through-vias 30-1 and 30-2. Through-vias 32 are also formed to penetrate through dielectric region 38 and connecting to metal pads 24A. Metal pads 76 are formed on the top surface of dielectric region 38, and are electrically connected to the tier-1 dies and the tier-2 dies. The respective process is illustrated as process 210 in the process flow shown in FIG. 45.

Figure 29:
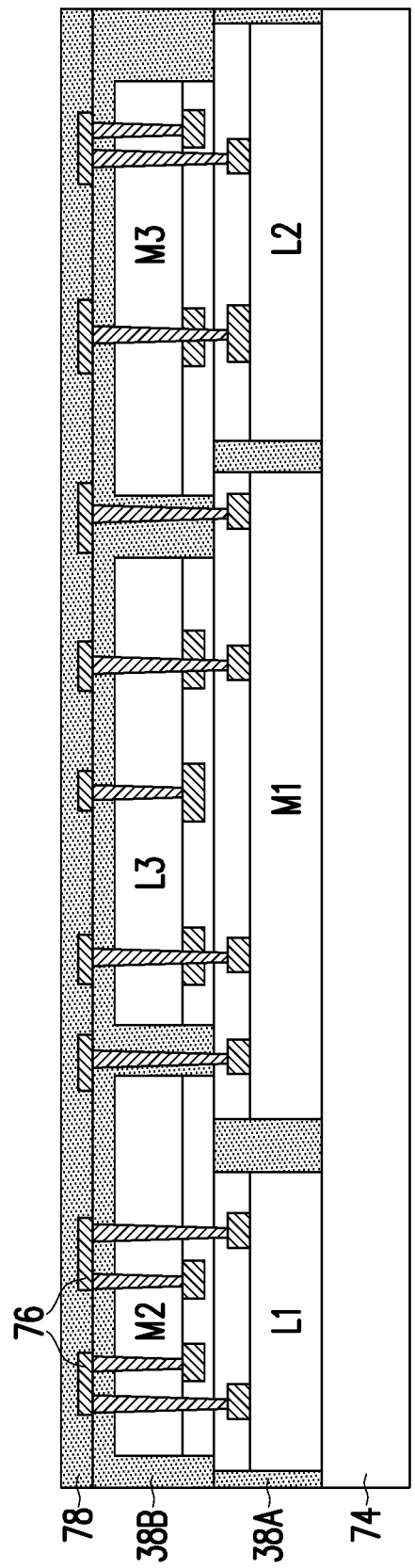
Figure 30:
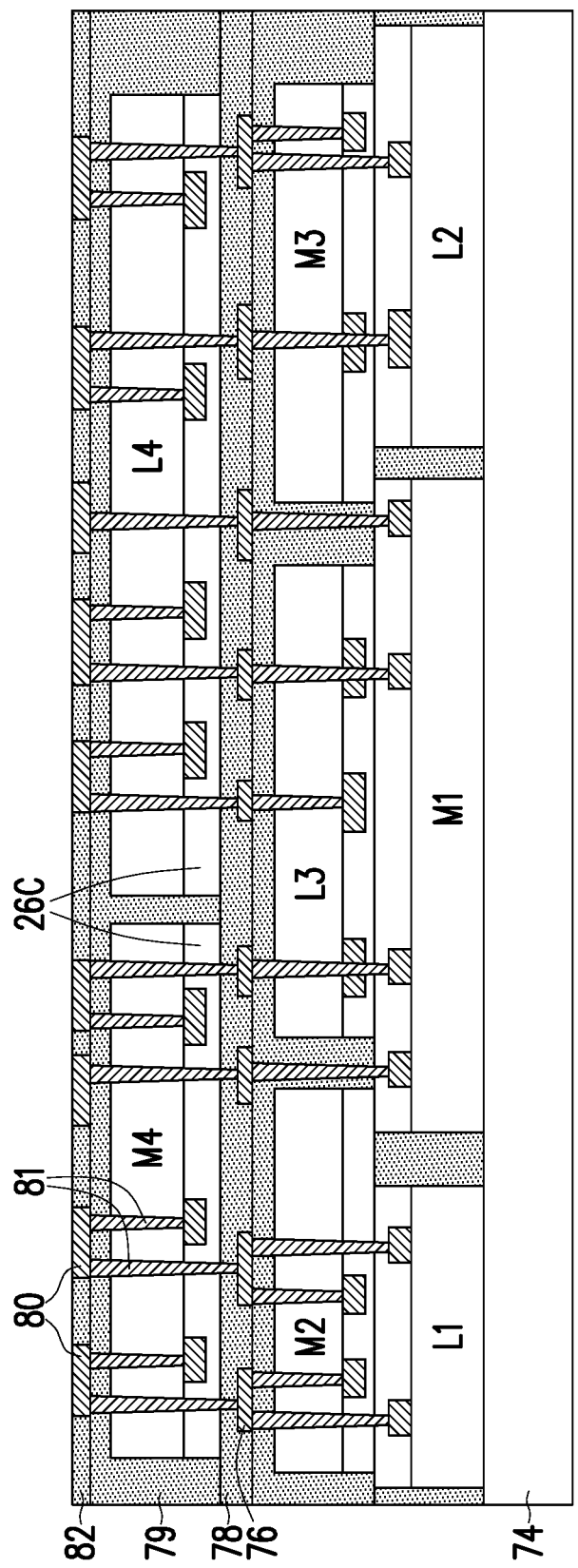

FIG. 29 illustrates the deposition and the planarization of dielectric layer 78, which may be formed of an oxide such as silicon oxide, SiOC, SiCN, SiN, or the like. The respective process is illustrated as process 212 in the process flow shown in FIG. 45. Metal pads 76 are thus covered by dielectric layer 78. Next, as shown in FIG. 30, the tier-3 dies such as logic die L4 and memory die M4 are bonded to dielectric layer 78. The respective process is illustrated as process 214 in the process flow shown in FIG. 45. The surface dielectric layers 26C of the tier-3 dies are bonded to dielectric layer 78 through direct dielectric bonding. The tier-3 dies L4 and M4 are then thinned, for example, in a CMP process or a mechanical grinding process. Dielectric layer 79 is then deposited to encapsulate the tier-3 dies, followed by a planarization process. Through-vias 81 are formed to penetrate through the substrates in the tier-3 dies and a top portion of dielectric layer 79. Metal pads 80 are then formed on the surface of dielectric layer 79 and connected to through-vias 81. The respective process is illustrated as process 216 in the process flow shown in FIG. 45. Dielectric layer 82 is then deposited and planarized. The respective process is illustrated as process 218 in the process flow shown in FIG. 45. Metal pads 80 may be exposed, or remain covered by dielectric 82 after the planarization.

Figure 31:
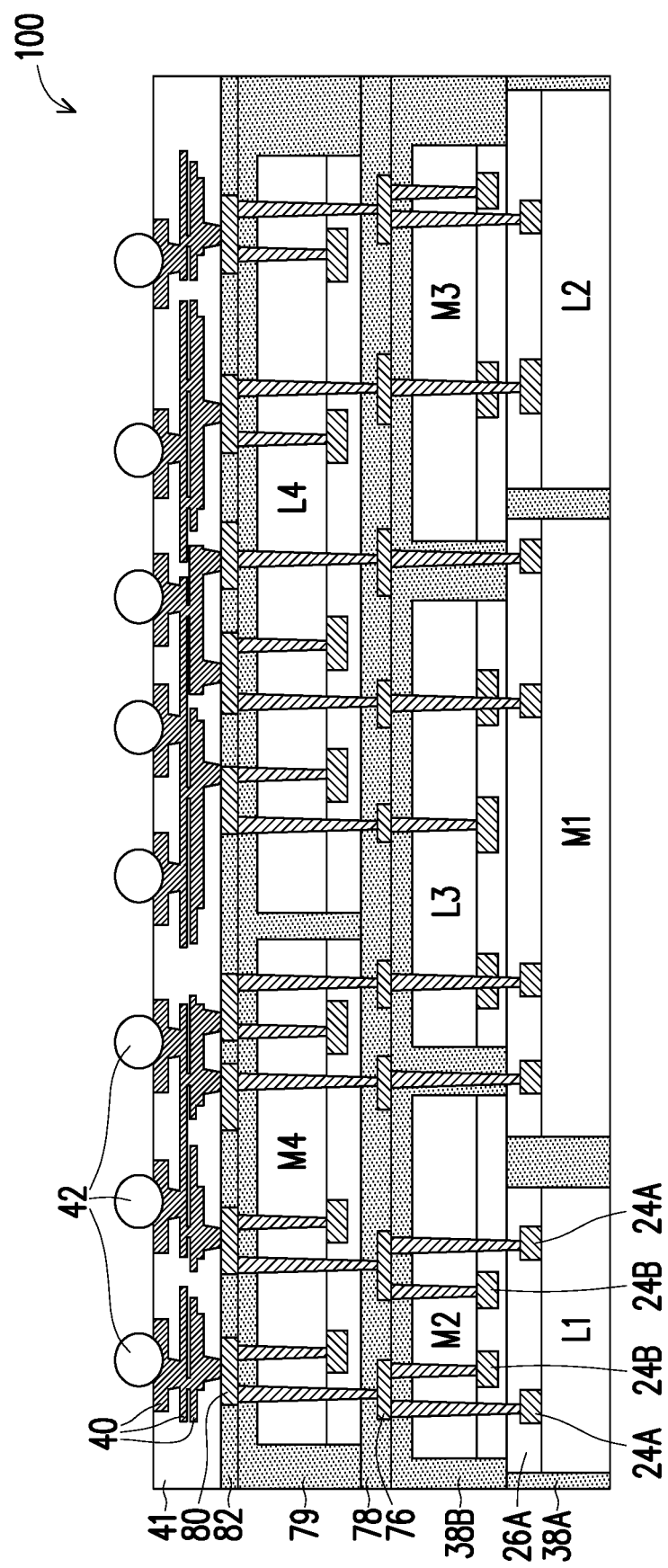

FIG. 31 illustrates the formation of RDLs 40, dielectric layers 41, and solder region 42. The respective process is illustrated as process 220 in the process flow shown in FIG. 45. RDLs 40 and solder region 42 are electrically connected to the underlying tier-1, tier-2, and tier-3 dies. The resulting structure is also shown FIG. 5. Carrier 74 (FIG. 30) is then de-bonded, and a singulation process is performed to form a plurality of packages 100 identical to each other. The structure shown in FIG. 6 may be formed in similar processes, except that metal pillars 44 and dielectric layer 46 are formed.

FIGS. 32 through 39 illustrate the cross-sectional views of intermediate stages in the formation of compute-in-memory packages 100 as shown in FIG. 7 in accordance with some embodiments of the present disclosure. Unless specified otherwise, the materials and the formation processes of the components in FIGS. 32 through 39 (and in FIGS. 40 through 44) are essentially the same as the like components, which are denoted by like reference numerals in the embodiments shown in FIGS. 25 through 31. The details regarding the formation process and the materials of the components shown in FIGS. 32 through 44 may thus be found in the discussion of the embodiment shown in FIGS. 25 through 31.

Figure 32:
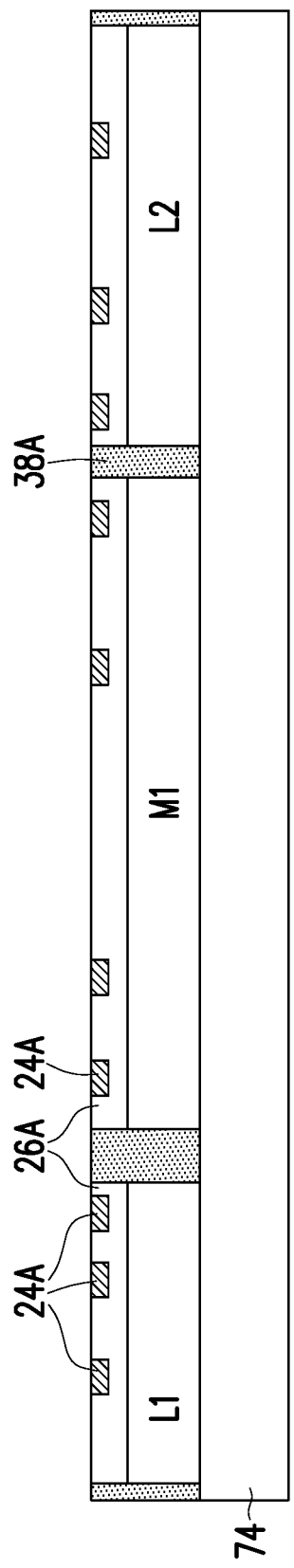
FIGS. 32 through 39 illustrate the cross-sectional views of intermediate stages in the formation of a package in accordance with some embodiments.

Referring to FIG. 32, tier-1 dies such as logic dies L1 and L2 and memory die M1 are placed on carrier 74, for example, through die-attach films (not shown). The front sides of the tier-1 dies face up. The gap between tier-1 dies L1, L2, and M1 is then filled with dielectrics film 38A with a further surface planarization process. Dielectric film may be formed of an oxide (such as silicon oxide), SiCN, SiN, SiOC, or the like. Metal pads 24A in the tier-1 dies are exposed, and are coplanar with the corresponding surface dielectric layers 26A.

Figure 33:
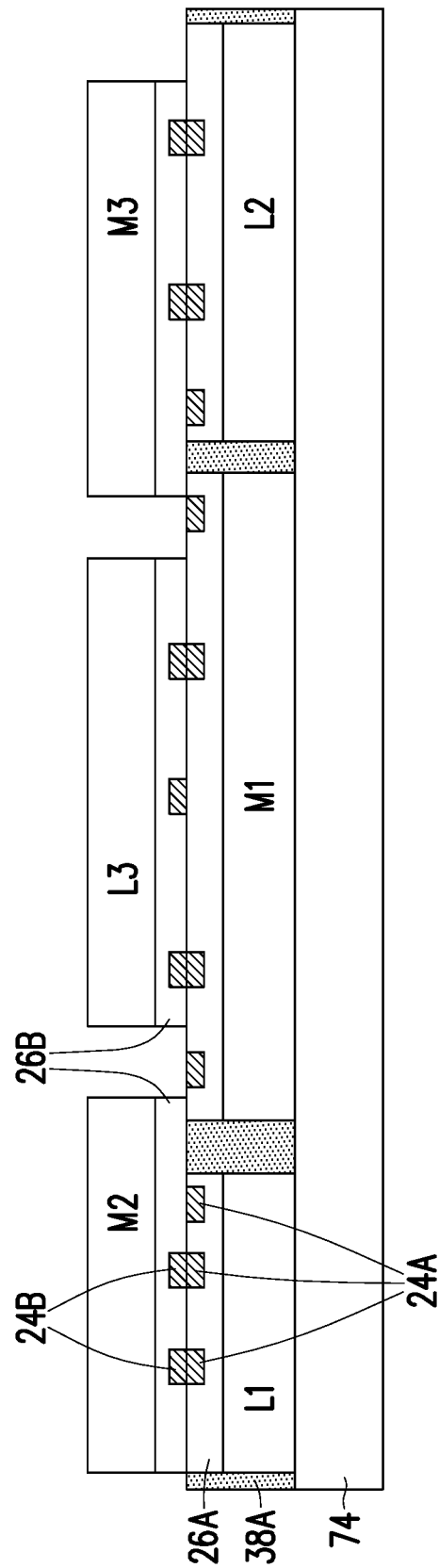
Figure 34:
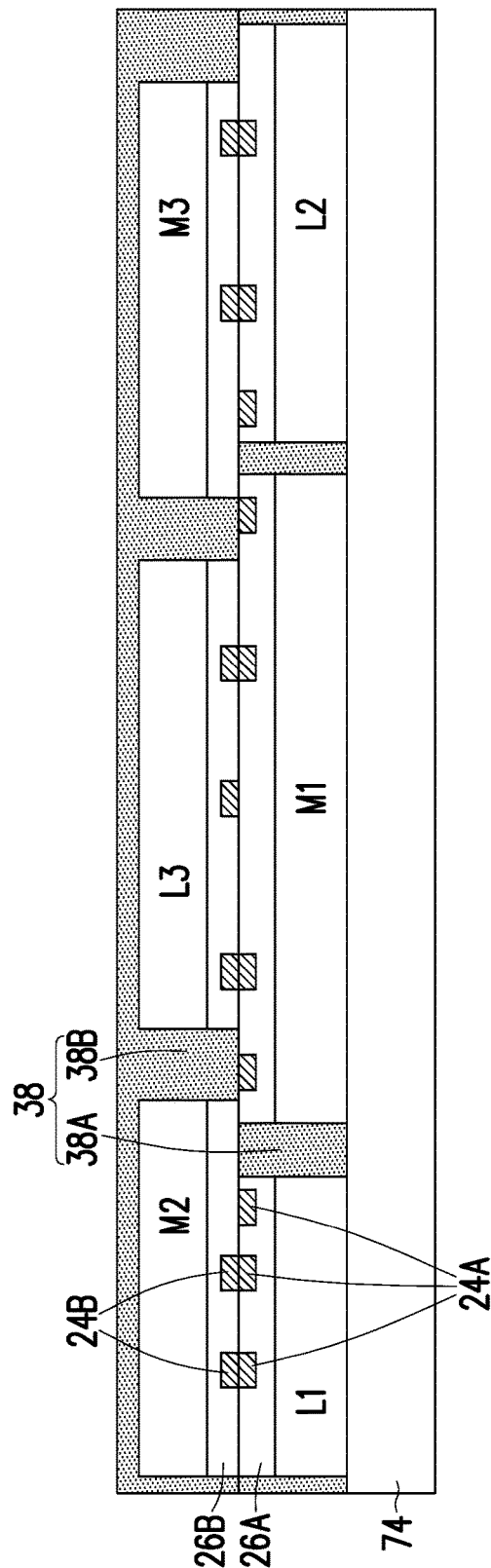

Next, as shown in FIG. 33, tier-2 dies such as logic dies L3 and memory dies M2 and M3 are bonded to the tier-1 dies L1, M1, and L2 through hybrid bonding, with dielectric layers 26B in the tier-2 dies bonded to dielectric layers 26A in the tier-1 dies, and metal pads 24B bonded to metal pads 24A. The tier-2 dies may then be thinned. Next, as shown in FIG. 34, a gap-filling process is performed, and dielectric region 38B is formed to fill the gaps as shown in FIG. 33. A planarization process such as a CMP process or a mechanical grinding process may be performed to level the top surface of dielectric region 38B. In accordance with alternative embodiments, the tier-1 dies and the tier-2 dies are encapsulated in a same encapsulating process, in which dielectric regions 38A and 38B form a continuous dielectric region, which is referred to as dielectric region 38.

Figure 35:
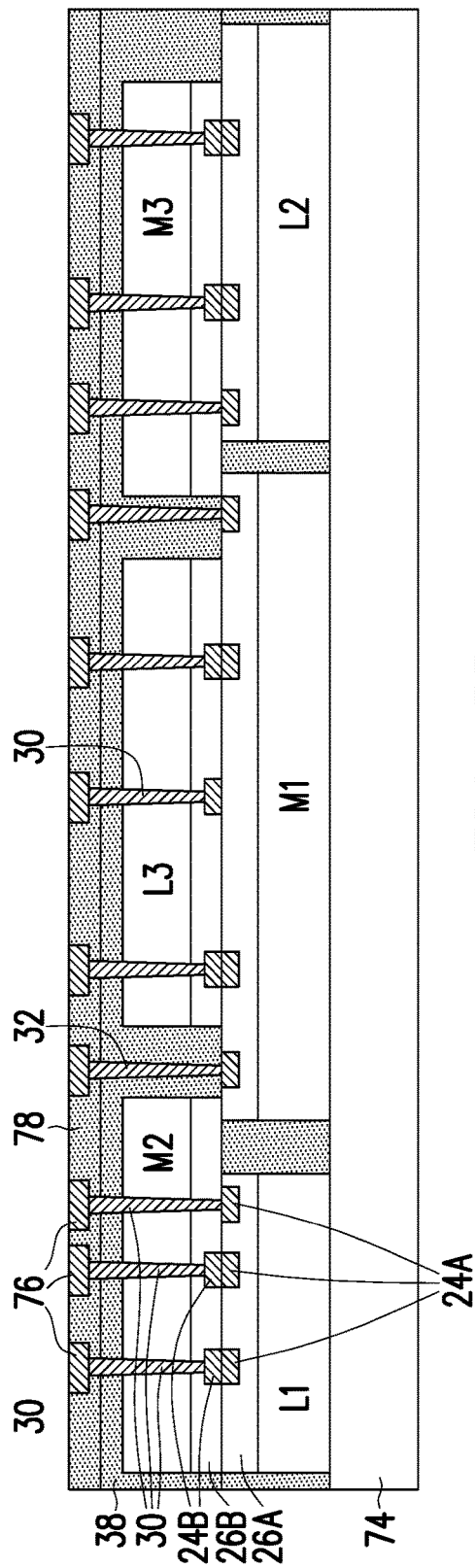

FIG. 35 illustrates the formation of through-vias 30 and 32. Some of through-vias 30 are electrically connected to bond pads 24B, which are further connected to bond pads 24A. Some of through-vias 30 are directly connected to bond pads 24A. Through-vias 32 are also formed to penetrate through dielectric region 38, and connect to metal pads 24A. Metal pads 76 are formed on the top of dielectric region 38, and are electrically connected to the tier-1 dies and the tier-2 dies.

Figure 36:
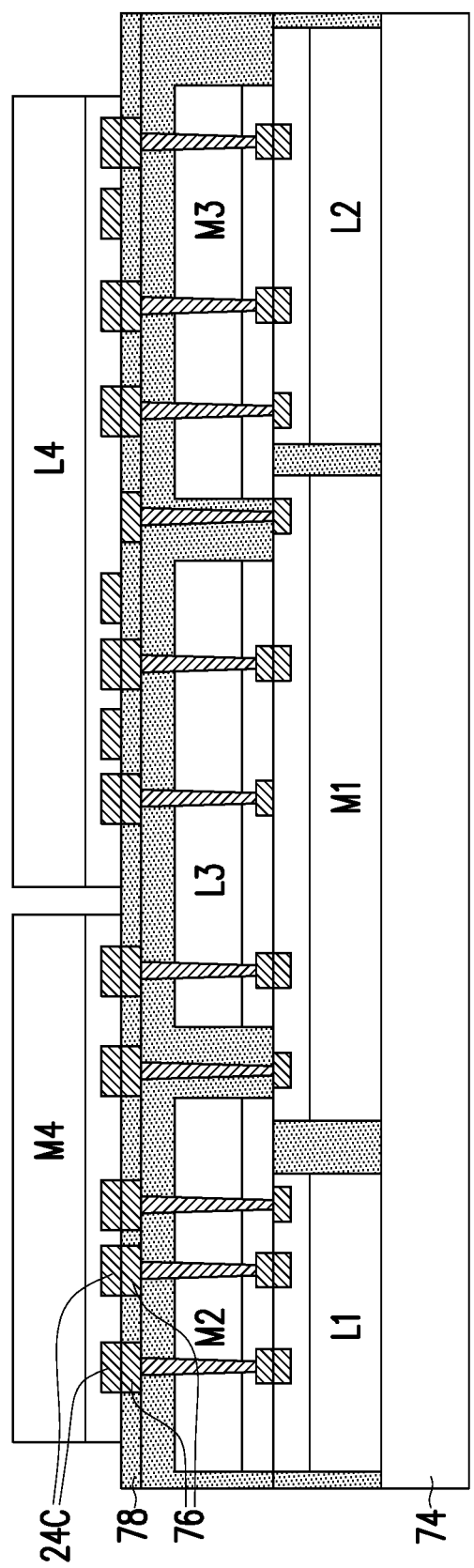

FIG. 35 further illustrates the deposition and the planarization of dielectric layer 78. Metal pads 76 are revealed as a result of the planarization, and have top surfaces coplanar with the top surface of dielectric layer 78. Next, as shown in FIG. 36, the tier-3 dies such as logic die L4 and memory die M4 are bonded to dielectric layer 78 and metal pads 76 through hybrid bonding. The tier-3 dies L4 and M4 are then thinned, for example, in a CMP process or a mechanical grinding process.

Figure 37:
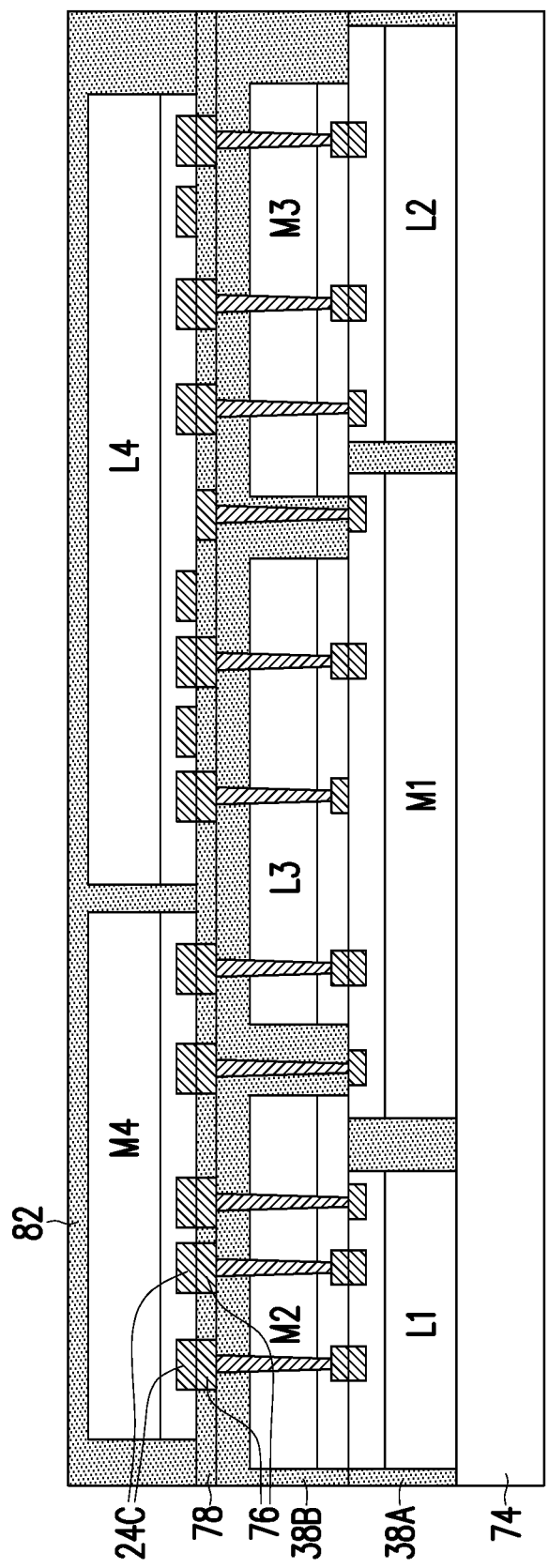
Figure 38:
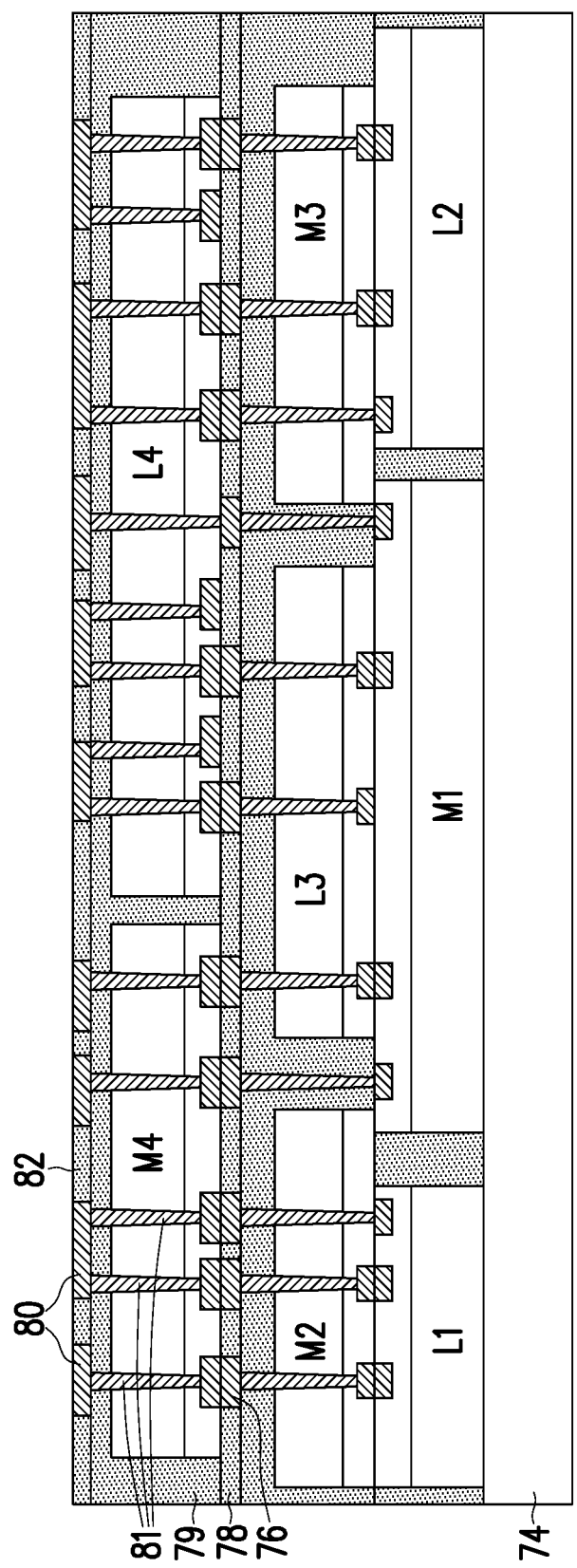

Referring to FIG. 37, dielectric layer 82 is deposited and planarized. Through-vias 81 and metal pads 80 are then formed, as shown in FIG. 38. Dielectric layer 82 is then formed and planarized. In the resulting structure, metal pads 80 may be exposed, or remaining covered by dielectric 82 after the planarization.

Figure 39:
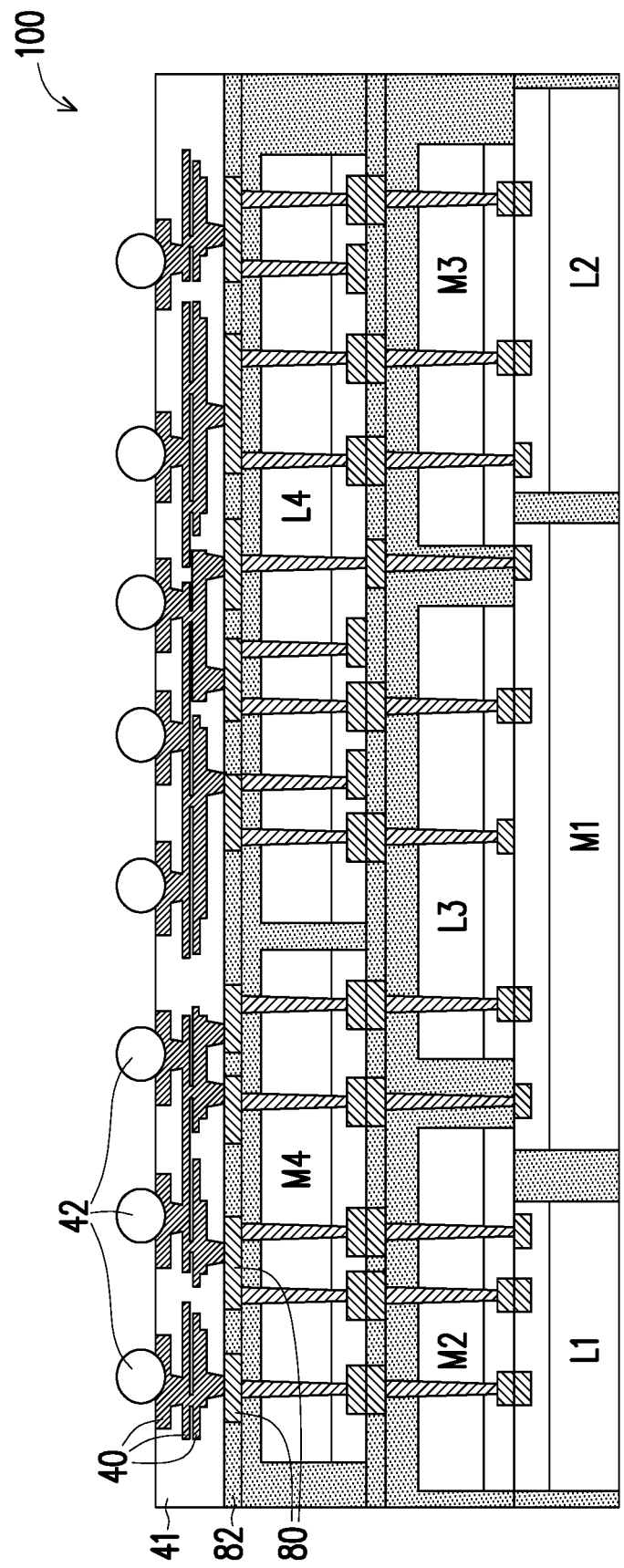

FIG. 39 illustrates the formation of RDLs 40, dielectric layers 41, and solder region 42. RDLs 40 and solder region 42 are electrically connected to the underlying tier-1, tier-2, and tier-3 dies. The resulting structure is also shown FIG. 7. Carrier 74 (FIG. 38) is then de-bonded, and a singulation process is performed to form a plurality of packages 100 identical to each other. The structure shown in FIG. 8 may be formed in similar processes, except that metal pillars 44 and dielectric layer 46 are formed.

FIGS. 40 through 44 illustrate the cross-sectional views of intermediate stages in the formation of compute-in-memory packages 100 as shown in FIG. 9 in accordance with some embodiments of the present disclosure. In accordance with some embodiments, tier-1 dies are dies L4 and M4, while the tier-1 dies may also be dies L1, M1, and L2 in accordance with alternative embodiments.

Figure 40:
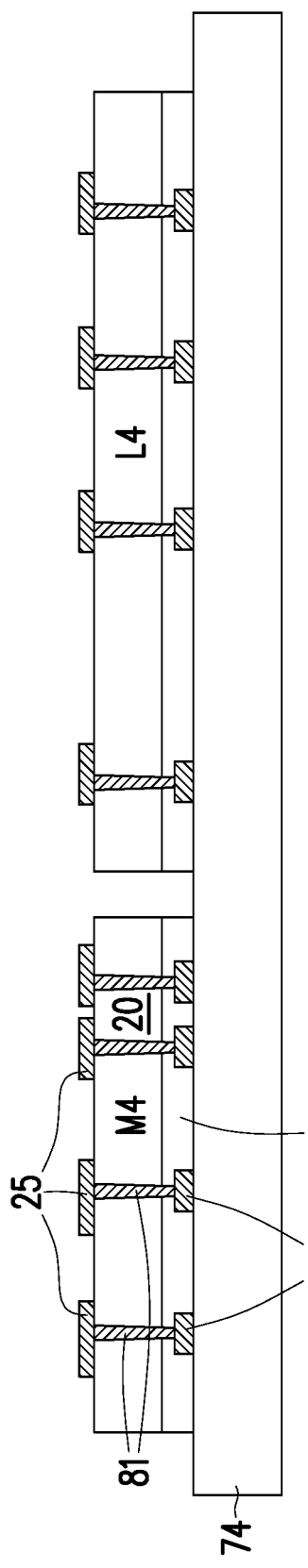
FIGS. 40 through 44 illustrate the cross-sectional views of intermediate stages in the formation of a package in accordance with some embodiments.
Figure 41:
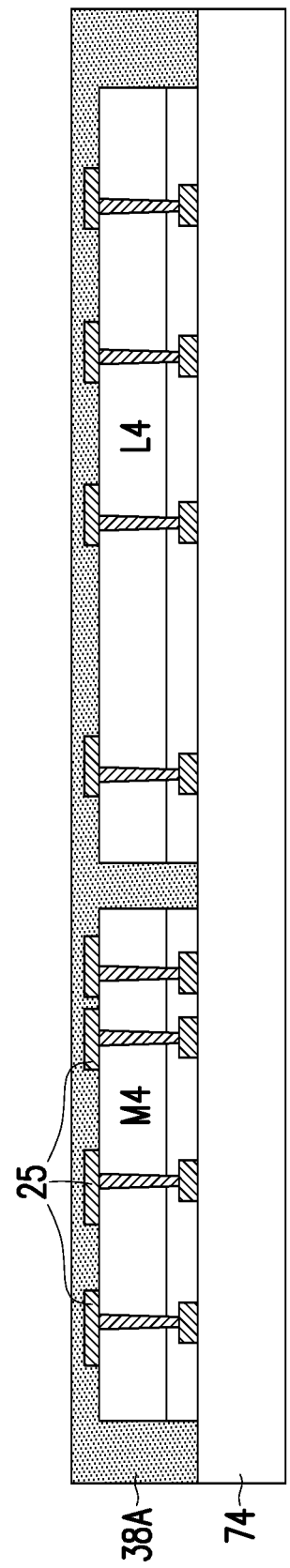

Referring to FIG. 40, tier-1 dies such as logic die L4 and memory die M4 are placed on carrier 74, for example, through die-attach films (not shown). The front sides of the tier-1 dies face down. Metal pads 25 are formed on the backside of the corresponding semiconductor substrates 20, with through-vias 81 interconnecting metal pads 25 and 24C. To avoid Cu diffusion into the silicon substrate, a dielectrics insulation film (not shown) is deposited between metal pads 25 and silicon substrate, and fills around through-vias 81. Next, as shown in FIG. 41, dielectric region 38A is formed to encapsulate the tier-1 dies therein, and is then planarized. Dielectric region 38A may be formed of an oxide such as silicon oxide or SiON.

Figure 42:
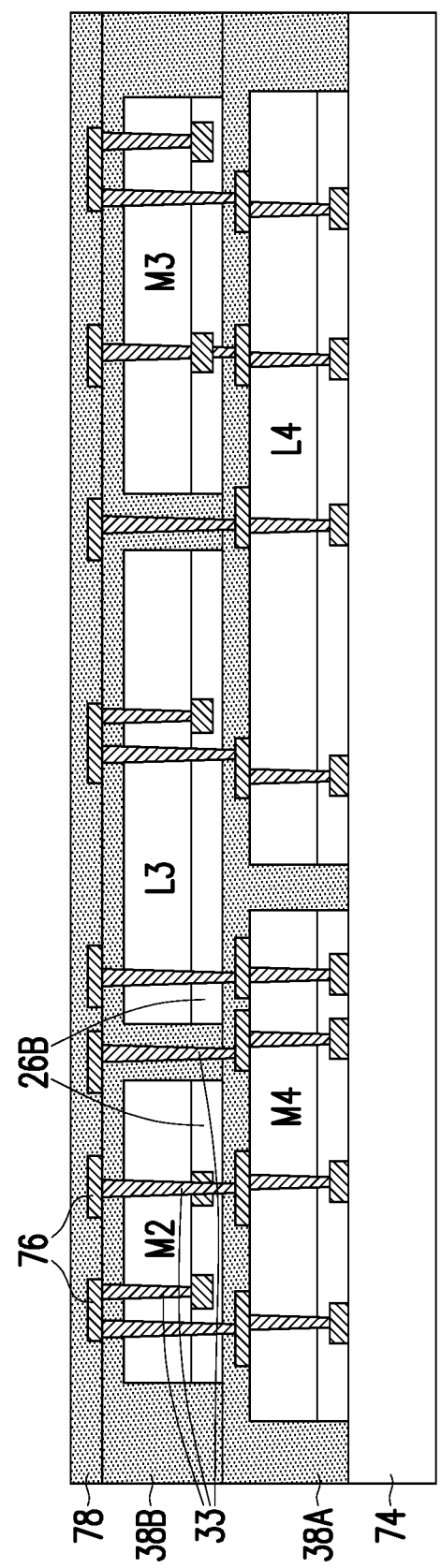

Next, as shown in FIG. 42, the tier-2 dies such as logic die L3 and memory dies M2 and M3 are bonded to dielectric region 38A through direct dielectric bonding, with dielectric layers 26B in the tier-2 dies bonded to dielectric region 38A. The tier-2 dies may then be thinned, followed by the formation of through-vias 33. Next, as also shown in FIG. 42, a gap-filling process is performed, and dielectric region 38B is formed to fill the gaps between the tier-2 dies L3, M2, and M3, with a portion of dielectric region 38B being overlapping tier-2 dies L3, M2, and M3. A planarization process such as a CMP process or a mechanical grinding process may be performed to level the top surface of dielectric region 38B.

FIG. 42 also illustrates the formation of metal pads 76 on the top surface of dielectric region 38B, and the deposition and the planarization of dielectric layer 78. Metal pads 76 are covered by dielectric layer 78.

Figure 43:
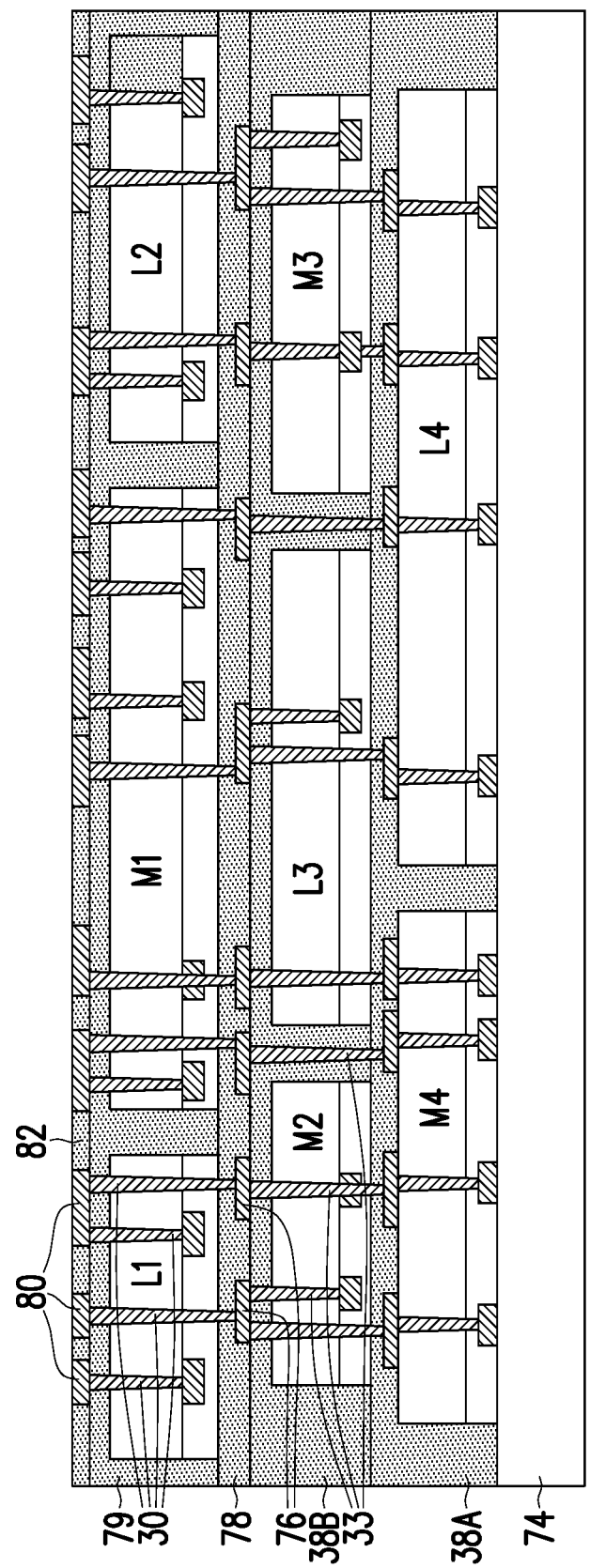

Next, as shown in FIG. 43, the tier-3 dies such as logic dies L1 and L2 and memory die M1 are bonded to dielectric layer 78 through direct dielectric bonding. The tier-3 dies are then thinned, for example, in a CMP process or a mechanical grinding process. Dielectric layer 79 is then deposited and planarized.

Further referring to FIG. 43, through-vias 30 are formed, and metal pads 80 are formed to connect to through-vias 30. Metal pads 80 are formed on dielectric layer 79, and are in contact with through-vias 30. Dielectric layer 82 is then formed and planarized. In the resulting structure, metal pads 80 may be exposed, or remain covered by dielectric 82 after the planarization.

Figure 44:
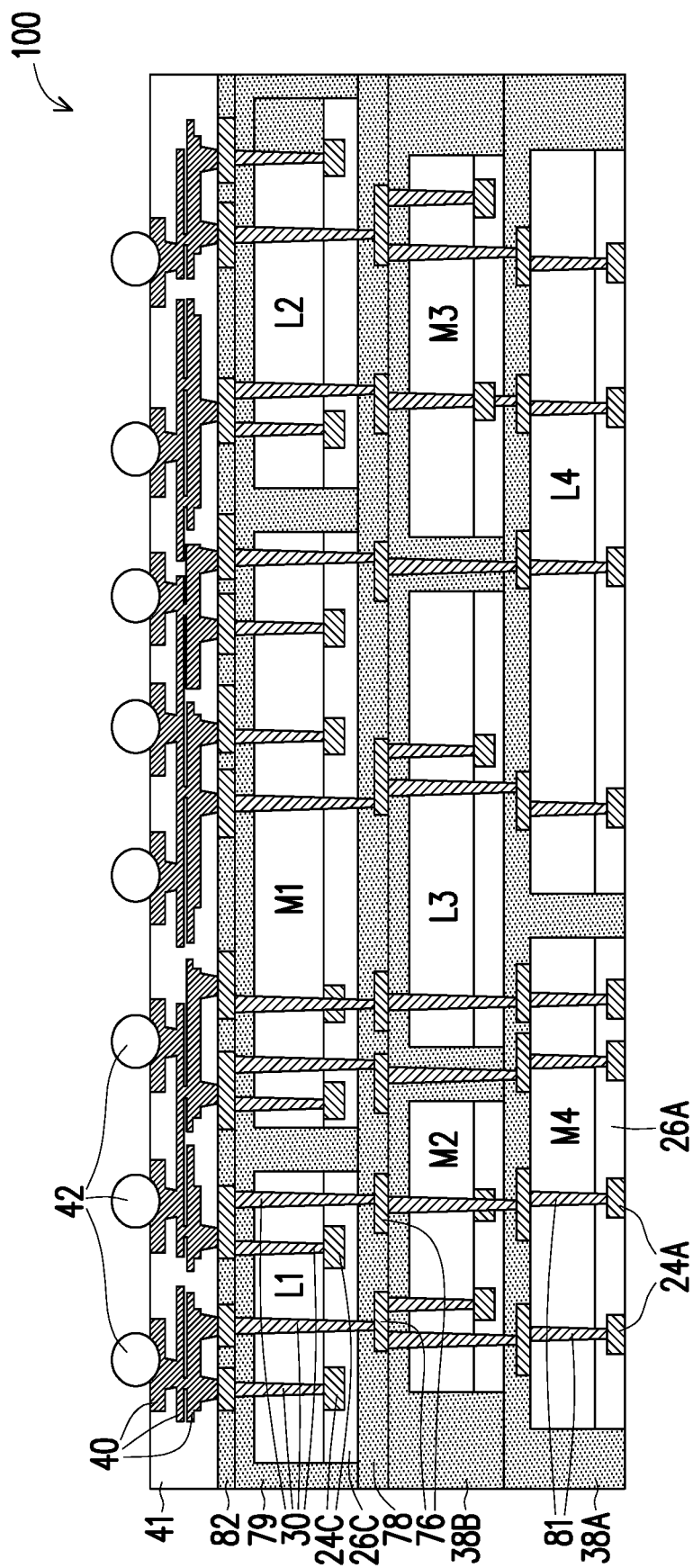

FIG. 44 illustrates the formation of RDLs 40, dielectric layers 41, and solder region 42. RDLs 40 and solder region 42 are electrically connected to the underlying tier-1, tier-2, and tier-3 dies. The resulting structure is also shown FIG. 9. Carrier 74 (FIG. 43) is then de-bonded, and a singulation process is performed to form a plurality of packages 100 identical to each other. The structure shown in FIG. 10 may be formed in similar processes, except that metal pillars 44 and dielectric layer 46 are formed.

The process flows for forming the structures shown in FIGS. 11 and 12 may be realized through the processes as shown in FIGS. 25 through 44, and are not shown herein.

In above-illustrated embodiments, some processes and features are discussed in accordance with some embodiments of the present disclosure. Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The embodiments of the present disclosure have some advantageous features. By immersing the logic dies in memory dies, and memory dies in logic dies, the computing efficiency may be improved, the bandwidth of the system may be increased, and the latency may be reduced due to the close proximity of the dies and the efficient layout.

In accordance with some embodiments of the present disclosure, a method of forming an integrated circuit package includes placing a first plurality of dies over a carrier, wherein the first plurality of dies comprise at least a first logic die and a first memory die; placing a second plurality of dies over the first plurality of dies, wherein the second plurality of dies are electrically coupled to the first plurality of dies, and wherein the second plurality of dies comprise at least a second logic die and a second memory die; placing a third plurality of dies over the second plurality of dies, wherein the third plurality of dies are electrically coupled to the first plurality of dies and the second plurality of dies, and wherein the third plurality of dies comprise at least a third logic die and a third memory die; and forming electrical connectors over and electrically coupling to the first plurality of dies, the second plurality of dies, and the third plurality of dies. In an embodiment, the method further includes bonding the second plurality of dies to the first plurality of dies through direct dielectric bonding. In an embodiment, the method further includes bonding the second plurality of dies to the first plurality of dies through hybrid bonding. In an embodiment, the method further includes filling a first dielectric material, wherein the first dielectric material continuously extends into gaps between the first plurality of dies and gaps between the second plurality of dies, wherein the first dielectric material has a portion covering the second plurality of dies; forming metal pads over the first dielectric material; forming a second dielectric material to cover the metal pads; and bonding the third plurality of dies to the second dielectric material through dielectric-to-dielectric bonding. In an embodiment, one of the second plurality of dies is physically bonded to both a first one and a second one of the first plurality of dies. In an embodiment, the method further includes forming a through-via physically connecting the one of the second plurality of dies to the first one of the first plurality of dies, and there is no direct electrical connection between the one of the second plurality of dies and the second one of the first plurality of dies. In an embodiment, the forming the electrical connectors comprises forming solder regions. In an embodiment, the forming the electrical connectors comprises: forming a dielectric layer over the third plurality of dies; and forming metal pillars in the dielectric layer, with top surfaces of the metal pillars being coplanar with a top surface of the dielectric layer. In an embodiment, the method further includes performing a die-saw to form a plurality of packages, wherein the first plurality of dies, the second plurality of dies, and the third plurality of dies are in one of the plurality of packages. In an embodiment, the method further includes bonding the one of the plurality of packages to a package component through flip-chip bonding; and encapsulating the one of the plurality of packages in an encapsulant. In an embodiment, the method further includes encapsulating the one of the plurality of packages in an encapsulant; and forming redistribution lines and dielectric layers overlapping both the one of the plurality of packages and the encapsulant.

In accordance with some embodiments of the present disclosure, a method of forming an integrated circuit package includes placing first-tier dies; bonding second-tier dies to the first-tier dies; filling a first gap-filling dielectric material, wherein the first gap-filling dielectric material is filled into both gaps between the first-tier dies and gaps between the second-tier dies; forming first through-vias penetrating through the second-tier dies, wherein the first through-vias electrically couple the second-tier dies to the first-tier dies; forming metal pads over the first gap-filling dielectric material and electrically coupling to the first through-vias; forming a dielectric layer covering the metal pads; bonding third-tier dies to the dielectric layer, wherein each tier of the first-tier dies, second-tier dies, and the third-tier dies comprises at least a logic die and a memory die; and forming second through-vias penetrating through the third-tier dies to electrically couple to the metal pads. In an embodiment, the first through-vias comprise a first through-via terminating in one of the second-tier dies, and a second through-via terminating in one of the first-tier dies. In an embodiment, the second-tier dies are bonded to the first-tier dies through hybrid bonding. In an embodiment, one of the first through-vias penetrates through a metal pad in the second-tier dies to land on a metal pad on one of the first-tier dies.

In accordance with some embodiments of the present disclosure, an integrated circuit package includes a first plurality of dies over a carrier, wherein the first plurality of dies comprise at least a first logic die and a first memory die; a second plurality of dies over the first plurality of dies, wherein the second plurality of dies are electrically coupled to the first plurality of dies, and wherein the second plurality of dies comprise at least a second logic die and a second memory die; a first dielectric layer over the second plurality of dies; first through-vias penetrating through the first dielectric layer and the second plurality of dies to electrically couple to the first plurality of dies; first metal pads over and contacting the first through-vias; a second dielectric layer covering the first metal pads; a third plurality of dies over and bonded to the second dielectric layer; and second through-vias penetrating through the second dielectric layer and the third plurality of dies to electrically couple to the first metal pads. In an embodiment, the integrated circuit package further includes second metal pads over and physically connected to the second through-vias. In an embodiment, surface dielectric layers of the second plurality of dies are bonded to surface dielectric layers of the first plurality of dies through direct dielectric bonding, with the second plurality of dies electrically coupling to the first plurality of dies through the first through-vias. In an embodiment, the first through-vias comprise a through-via physically contacting a metal pad in one of the second plurality of dies and a metal pad in one of the first plurality of dies. In an embodiment, surface dielectric layers of the second plurality of dies are bonded to surface dielectric layers of the first plurality of dies, and bond pads of the second plurality of dies are bonded to bond pads of the first plurality of dies.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated circuit package, the method comprising:
   placing a first plurality of dies over a carrier, wherein the first plurality of dies comprise at least a first logic die and a first memory die;
   placing a second plurality of dies over the first plurality of dies, wherein the second plurality of dies are electrically coupled to the first plurality of dies, and wherein the second plurality of dies comprise at least a second logic die and a second memory die;
   after the second plurality of dies are placed, forming a through-via extending into one of the second plurality of dies, wherein the through-via lands on a metal pad in the one of the second plurality of dies;
   placing a third plurality of dies over the second plurality of dies, wherein the third plurality of dies are electrically coupled to the first plurality of dies and the second plurality of dies, and wherein the third plurality of dies comprise at least a third logic die and a third memory die; and
   forming electrical connectors over and electrically coupling to the first plurality of dies, the second plurality of dies, and the third plurality of dies.

2. The method of claim 1 further comprising bonding the second plurality of dies to the first plurality of dies through direct dielectric bonding, wherein at a time of the direct dielectric bonding, the second plurality of dies are electrically de-coupled from the first plurality of dies.

3. The method of claim 1 further comprising filling a dielectric material between the second plurality of dies, wherein the dielectric material comprises a top portion overlapping the one of the plurality of dies, wherein the through-via penetrates through the top portion of the dielectric material.

4. The method of claim 1 further comprising:
   filling a first dielectric material, wherein the first dielectric material continuously extends into gaps between the first plurality of dies and gaps between the second plurality of dies, wherein the first dielectric material has a portion covering the second plurality of dies;
   forming metal pads over the first dielectric material;
   forming a second dielectric material to cover the metal pads; and
   bonding the third plurality of dies to the second dielectric material through dielectric-to-dielectric bonding.

5. The method of claim 1, wherein one of the second plurality of dies is physically bonded to both a first one and a second one of the first plurality of dies.

6. The method of claim 5 further comprising forming a through-via physically connecting the one of the second plurality of dies to the first one of the first plurality of dies, and there is no direct electrical connection between the one of the second plurality of dies and the second one of the first plurality of dies.

7. The method of claim 1, wherein the forming the electrical connectors comprises forming solder regions.

8. The method of claim 1, wherein the forming the electrical connectors comprises:
   forming a dielectric layer over the third plurality of dies; and
   forming metal pillars in the dielectric layer, with top surfaces of the metal pillars being coplanar with a top surface of the dielectric layer.

9. The method of claim 1 further comprising:
performing a die-saw to form a plurality of packages, wherein the first plurality of dies, the second plurality of dies, and the third plurality of dies are in one of the plurality of packages.

10. The method of claim 9 further comprising:
bonding the one of the plurality of packages to a package component through flip-chip bonding; and
encapsulating the one of the plurality of packages in an encapsulant.

11. The method of claim 9 further comprising:
encapsulating the one of the plurality of packages in an encapsulant; and
forming redistribution lines and dielectric layers overlapping both the one of the plurality of packages and the encapsulant.

12. A method of forming an integrated circuit package, the method comprising:
placing first-tier dies;
bonding second-tier dies to the first-tier dies;
filling a first gap-filling dielectric material, wherein the first gap-filling dielectric material is filled into both gaps between the first-tier dies and gaps between the second-tier dies;
after the first gap-filling dielectric material is filled, forming first through-vias extending into the second-tier dies, wherein at least a lower portion of each of the first through-vias is inside one of the second-tier dies, and wherein the first through-vias electrically couple the second-tier dies to the first-tier dies;
forming metal pads over the first gap-filling dielectric material and electrically coupling to the first through-vias;
forming a dielectric layer covering the metal pads;
bonding third-tier dies to the dielectric layer, wherein each tier of the first-tier dies, second-tier dies, and the third-tier dies comprises at least a logic die and a memory die; and
forming second through-vias penetrating through the third-tier dies to electrically couple to the metal pads.

13. The method of claim 12, wherein the first through-vias comprise a first through-via terminating in one of the second-tier dies, and a second through-via terminating in one of the first-tier dies.

14. The method of claim 12, wherein the first gap-filling dielectric material comprises a top portion overlapping the second-tier dies, and each of the first through-vias penetrates through the top portion of the first gap-filling dielectric material.

15. The method of claim 12, wherein one of the first through-vias penetrates through a metal pad in the second-tier dies to land on a metal pad on one of the first-tier dies.

16. A method of forming an integrated circuit package, the method comprising:
placing a first plurality of dies, wherein the first plurality of dies comprise a first device die;
bonding a second plurality of dies over the first plurality of dies, wherein the second plurality of dies comprise a second device die;
encapsulating the second plurality of dies in a gap-filling material;
planarizing the gap-filling material, wherein the gap-filling material has a top portion covering the second plurality of dies; and
after the gap-filling material is planarized, forming a first through-via penetrating through the second device die, wherein the first through-via electrically connects the second device die to the first device die.

17. The method of claim 16, wherein the first through-via is stopped on a first metal pad in the first device die.

18. The method of claim 17, wherein the first through-via penetrates through a second metal pad in the second device die, and wherein the first through-via is in physical contact with the second metal pad.

19. The method of claim 16 further comprising:
forming a second through-via penetrating through a semiconductor substrate of the second device die, wherein the second through-via is stopped on an additional metal pad in the second device die.

20. The method of claim 16 further comprising forming a third metal pad over and contacting the first through-via.

21. The method of claim 20 further comprising:
depositing a dielectric layer on the third metal pad;
bonding a third device die to the dielectric layer; and
forming an additional through-via penetrating through the third device die and the dielectric layer to contact the third metal pad.

* * * * *